United States Patent
Green et al.

(10) Patent No.: US 9,843,311 B2
(45) Date of Patent: Dec. 12, 2017

(54) INTEGRATED LEVEL SHIFTER CIRCUIT

(71) Applicant: Peregrine Semiconductor Corporation, San Diego, CA (US)

(72) Inventors: Merlin Green, San Diego, CA (US); Mark L. Burgener, San Diego, CA (US); James W. Swonger, Cocoa, FL (US); Buddhika Abesingha, Escondido, CA (US); Ronald Eugene Reedy, San Diego, CA (US)

(73) Assignee: Peregrine Semiconductor Corporation, San Diego, CA (US)

( * ) Notice: Subject to any disclaimer, the term of this patent is extended or adjusted under 35 U.S.C. 154(b) by 0 days.

(21) Appl. No.: 15/286,097

(22) Filed: Oct. 5, 2016

(65) Prior Publication Data
US 2017/0117883 A1   Apr. 27, 2017

Related U.S. Application Data

(63) Continuation of application No. 14/661,848, filed on Mar. 18, 2015, now Pat. No. 9,484,897.

(51) Int. Cl.
*H03K 3/356* (2006.01)
*H01L 27/12* (2006.01)
(Continued)

(52) U.S. Cl.
CPC ... *H03K 3/356104* (2013.01); *H01L 27/1203* (2013.01); *H01L 29/0649* (2013.01);
(Continued)

(58) Field of Classification Search
CPC ............ H03K 3/356104; H03K 17/689; H01L 27/1203; H01L 29/1095;
(Continued)

(56) References Cited

U.S. PATENT DOCUMENTS 7,199,617 B1   4/2007   Schrom et al.
8,049,532 B1   11/2011  Maangat et al.
(Continued)

FOREIGN PATENT DOCUMENTS

EP   2731269   5/2014
EP   2787642   10/2014
(Continued)

OTHER PUBLICATIONS

Martinez, Martinez, Written Opinion of the International Preliminary Examining Authority received from the EPO dated Feb. 15, 2017 for appln No. PCT/US2016/015691, 12 pgs.
(Continued)

*Primary Examiner* — Yemane Mehari
(74) *Attorney, Agent, or Firm* — Jaquez Land Greenhaus LLP; Martin J. Jaquez, Esq.; Alessandro Steinfl, Esq.

(57) ABSTRACT

Systems, methods, and apparatus for use in biasing and driving high voltage semiconductor devices using only low voltage transistors are described. The apparatus and method are adapted to control multiple high voltage semiconductor devices to enable high voltage power control, such as power amplifiers, power management and conversion and other applications wherein a first voltage is large compared to the maximum voltage handling of the low voltage control transistors. A DC/DC power conversion implementation from high input voltage to low output voltage using a novel level shifter which uses only low voltage transistors is also provided. Also presented is a level shifter in which floating nodes and high voltage capacitive coupling and control enable the high voltage control with low voltage transistors.

45 Claims, 20 Drawing Sheets

(51) Int. Cl.
*H03K 17/689* (2006.01)
*H01L 29/06* (2006.01)
*H01L 29/10* (2006.01)
*H02M 3/158* (2006.01)

(52) U.S. Cl.
CPC ........ *H01L 29/1095* (2013.01); *H02M 3/158* (2013.01); *H03K 17/689* (2013.01)

(58) Field of Classification Search
CPC .... H02M 3/156–3/158; H02M 3/1584; H02M 3/1588
USPC .................................................. 323/271–285
See application file for complete search history.

(56) References Cited

U.S. PATENT DOCUMENTS

| | | | |
|---|---|---|---|
| 8,493,101 B2 | 7/2013 | Vogler et al. | |
| 8,593,128 B2* | 11/2013 | Burns | H03K 17/102 323/224 |
| 9,484,897 B2 | 11/2016 | Green et al. | |
| 2005/0156631 A1 | 7/2005 | Huang | |
| 2006/0087470 A1 | 4/2006 | Abdoulin | |
| 2007/0159150 A1* | 7/2007 | Hosokawa | H02M 3/1588 323/285 |
| 2008/0224755 A1 | 9/2008 | Hiroaki | |
| 2009/0206817 A1 | 8/2009 | Ng et al. | |
| 2013/0314065 A1* | 11/2013 | Jian | G05F 1/46 323/284 |
| 2014/0333365 A1 | 11/2014 | Takahashi | |
| 2015/0229307 A1 | 8/2015 | Badrudduza et al. | |
| 2016/0164413 A1* | 6/2016 | Akiyama | H03K 17/04206 323/271 |
| 2016/0277008 A1 | 9/2016 | Green et al. | |
| 2016/0277012 A1 | 9/2016 | Abesingha et al. | |

FOREIGN PATENT DOCUMENTS

| | | |
|---|---|---|
| WO | 2016148782 | 9/2016 |
| WO | 2017123269 | 7/2017 |

OTHER PUBLICATIONS

Peregrine Semiconductor Corporation, Reply to Written Opinion filed inthe EPO dated Apr. 14, 2017 for appln. No. PCT/US2016/015691, 26 pgs.

Ghilini, Marie, International Preliminary Report on Patentability received from the EPO dated Jun. 16, 2017 for appln. No. PCT/US2016/015691, 23 pgs.

Le, Dung Anh, Office Action received from the USPTO dated Jun. 30, 2017 for U.S. Appl. No. 15/385,618, 9 pgs.

Mehari, Yemane, Notice of Allowance received from the USPTO dated Jul. 27, 2016 for U.S. Appl. No. 14/661,848, 20 pgs.

Duperron, Nathalie, International Search Report and Written Opinion received from the EPO dated 20/19/16 for Appln. No. PCT/US2016/024023, 15 pgs.

Yu, et al., "A 60-V, > 225° C. Half-Bridge Driver for Piezoelectric Acoustic Transducer, on SOI CMOS", IEEE Transactions on Circuits and Systems . . . II: Express Briefs, vol. 59, No. 11, Nov. 2012, pp. 771-775.

Huque, et al., "Silicon-on-insulator-based high-voltage, high-temperature integrated circuit gate driver for silicon carbide-based power field effect transistors", IET Power Electronics, Sep. 10, 2008, revised Feb. 3, 2009, IET Power Electron, 2010, vol. 3, Issue 6, pp. 1001-1009.

Herzer, R., "Integrated gate driver circuit solutions", CIPS 2010, Mar. 16-18, Nuremberg/Germany, Paper 1.2, 10 pgs.

Mehari, Yemane, Office Action received from the USPTO dated Jul. 28, 2017 for U.S. Appl. No. 14/992,989, 47 pgs.

Peregrine Semiconductor Corporation, Demand and Amendment filed in the PEO dated Aug. 25, 2017 for Appln. No. PCT/US2016/024023, 22 pgs.

Abesignha, et al., Response filed in the USPTO dated Aug. 21, 2017 for U.S. Appl. No. 14/992,989, 4 pages.

Mehari, Yemane, Notice of Allowance received from the USPTO dated Oct. 23, 2017 for U.S. Appl. No. 14/992,989, 17 pages.

* cited by examiner

INTEGRATED LEVEL SHIFTER CIRCUIT

CROSS REFERENCE TO RELATED APPLICATIONS—CLAIM OF PRIORITY

This patent application is a continuation application of U.S. patent application Ser. No. 14/661,848, filed Mar. 18, 2015 entitled "Level Shifter", the disclosure of which is incorporated herein by reference in its entirety. The present application may be related to U.S. Pat. No. 5,416,043, issued on May 6, 1995 and entitled "Minimum charge FET fabricated on an ultrathin silicon on sapphire wafer", the disclosure of which is incorporated herein by reference in its entirety. The present application may also be related to U.S. Pat. No. 5,600,169, issued on Feb. 4, 1997 and entitled "Minimum charge FET fabricated on an ultrathin silicon on sapphire wafer", the disclosure of which is incorporated herein by reference in its entirety.

BACKGROUND

1. Field

Various embodiments described herein relate generally to systems, methods, and devices for use in biasing and driving high voltage semiconductor devices using only low breakdown voltage transistors.

2. Description of Related Art

In applications where high voltage semiconductor devices operating in high voltage conditions are controlled, high breakdown voltage transistors are typically used in corresponding control circuitry. For example, in traditional gallium nitride (GaN) power management applications, transistors such as laterally diffused metal oxide semiconductor (LDMOS), bipolar or high voltage metal-oxide-semiconductor field-effect transistors (MOSFETs) can be utilized to control the GaN devices operating in high voltage conditions. Since these control transistors typically have poor figure of merit (FOM), compared to the FOM of the GaN devices, which can thereby, for example, limit the operating frequencies of the GaN devices, the overall circuit (e.g. power management) can be limited in performance by the large, high voltage control transistors which can be difficult to charge and discharge quickly (e.g. their FOM is too high) and therefore the benefit of using the GaN devices can be substantially reduced.

SUMMARY

According to a first aspect of the present disclosure, a level shifter configured to control a high voltage device capable of withstanding a voltage higher than a first voltage is presented, the level shifter comprising: a circuital arrangement comprising transistor devices, each transistor device configured to withstand a second voltage substantially lower than the first voltage; a first supply terminal of the circuital arrangement, configured to carry a first switching voltage, the first switching voltage switching between a reference voltage and a voltage higher than the first voltage; a second supply terminal of the circuital arrangement, configured to carry a second switching voltage as a function of the first switching voltage, the second switching voltage substantially corresponding to a sum of the first switching voltage and the second voltage; an input terminal of the circuital arrangement, the input terminal configured to receive input timing control signals for controlling the high voltage device, the timing control signals configured to be coupled to the transistor devices of the circuital arrangement by way of a non-galvanic coupling; and an output terminal of the circuital arrangement, the output terminal configured to provide an output timing control signal at a voltage higher than the first voltage to the high voltage device, the output timing control signal being based on the coupled input timing control signals.

According to a second aspect of the present disclosure, a method for controlling a high voltage device capable of withstanding a voltage higher than a first voltage with low voltage devices capable of withstanding a second voltage, the first voltage being substantially higher than the second voltage is presented, the method comprising: providing a plurality of low voltage devices configured to withstand the second voltage; operating the plurality of low voltage devices between a first switching voltage and a second switching voltage, the first switching voltage switching between a reference voltage and a voltage higher than the first voltage, and the second switching voltage substantially corresponding to a sum of the first switching voltage and the second voltage; coupling the input timing control signals to the plurality of low voltage devices via a non-galvanic coupling; based on the operating and the coupling, generating, via the plurality of low voltage devices, an output timing control signal at a voltage higher than the first voltage; and based on the generating, controlling the high voltage device.

According to a third aspect of the present disclosure, a DC/DC converter for converting a first voltage to a lower voltage is presented, the DC/DC converter comprising: a transistor stack comprising a high side transistor and a low side transistor in series connection, the high side transistor and the low side transistor capable of withstanding a voltage higher than the first voltage; a supply terminal connected to a drain of the high side transistor configured, during operation, to receive the first voltage; a reference terminal connected to a source of the low side transistor configured, during operation, to receive a reference potential; an output switching terminal connected to a source of the high side transistor and to a drain of the low side transistor configured, during operation, to provide a switching voltage switching between the first voltage and the reference potential; a high side level shifter coupled to the transistor stack, comprising: i) a plurality of low voltage transistors capable of withstanding a second voltage substantially lower than the first voltage; ii) a high side reference terminal connected to the output switching terminal; iii) a high side supply terminal configured, during operation, to receive a high side supply voltage substantially equal to a sum of the switching voltage and the second voltage; iv) a high side input terminal configured, during operation, to receive input timing control signals for controlling the high side transistor; vi) a non-galvanic coupling coupled to the high side input terminal configured, during operation, to detect timing control information based on the input timing control signals; and v) a high side output transistor of the plurality of low voltage transistors coupled to a gate of the high side transistor configured, during operation, to provide a high side control signal based on the detected timing control information at a voltage higher than the first voltage, wherein the high side control signal controls a duty cycle of the switching voltage at the output switching terminal.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

DETAILED DESCRIPTION

Figure 1:
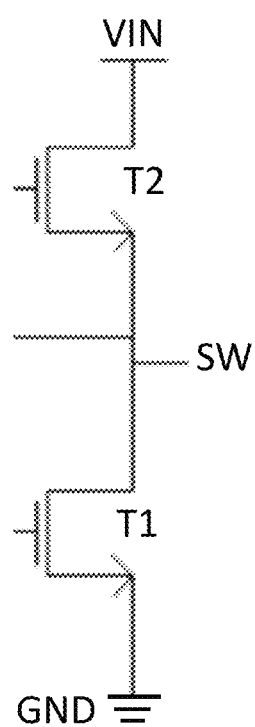
FIG. 1 shows two high voltage stacked transistors, a low side transistor, LS, T1, and a high side, HS, transistor T2.

It can be desirable to use small, low breakdown voltage MOSFET transistors which can have figure of merits (FOMs), as measured, for example, by the product of the ON resistance $R_{on}$ of the transistor and the gate charge $C_g$ of the transistor, similar to or better (lower) than the FOM of high voltage transistors (transistors with higher breakdown voltage) as controlling transistors in applications where high voltage semiconductor devices operating in high voltage conditions are controlled. Such MOSFETs can allow for best use of the GaN characteristics, thereby improving both performance and cost of the implementation. In addition, by implementing a single chip silicon on insulator (SOI) MOSFET solution based on low voltage MOSFETs, additional functionality can be included which address additional areas known to a person of ordinary skill in the art such as, but not limited to, GaN gate voltage overdrive protection, minimum gate drive requirements, dead time control, temperature stability, floating node tracking and startup voltage condition among others.

The present disclosure describes a level shifter circuit capable of driving control voltages or analog signals at relatively low voltages such as about 0 to 3.5/5V, while riding, or "flying," on top of high voltages substantially higher than the low voltages, such as 20-100 V or higher. The various embodiments presented herein describe low voltage control of high voltages performed by the novel level shifter which enables proper control of high voltage devices using low (breakdown) voltage transistors of the level shifter, where the low breakdown voltage is substantially smaller than the high voltage.

As used in the present disclosure, a high voltage device or high voltage transistor refers to a semiconductor transistor device which can withstand and block (e.g. in the OFF state) DC voltages (typically applied between the source and drain terminals of the transistor, or any two of drain, source and gate terminals) greater than 5-10 V, and more typically substantially greater than 5-10 V, such as greater than 20-100 V. Some exemplary high voltage devices are depletion mode GaN transistors (d-GaN), enhancement mode GaN transistors (e-GaN), stacked MOS transistors, and other high-voltage transistors known to a person skilled in the art, such as Si MOSFETs, hexagonal shape FETs (HEXFETs), LDMOS, indium phosphide (InP), etc. which can also be enhancement or depletion modes (e.g. e-type or d-type) and N or P polarity.

In the present disclosure e-GaN FET transistors are used as exemplary high voltage devices in order to describe the various embodiments of the present application, and therefore such exemplary usage should not be construed as limiting the scope of the invention as disclosed herewith. Unless explicitly mentioned as d-GaN, the terms GaN and e-GaN are considered synonymous herein.

A person skilled in the art can recognize that depletion mode d-GaN devices or other types of high voltage transistors such as Si MOSFETs, HEXFETs, LDMOS, InP (and all these examples can be of the e-type or d-type; and N or P polarity) or virtually any device capable of switching ON or OFF with high voltages applied can be controlled by the current invention.

E-GaN devices have typical threshold, or turn-on, voltages of approximately +0.7 to +3 V of gate-to-source voltage. Such devices are typically capable of withstanding 5 V to 200 V of drain-to-source, $V_{DS}$, voltage, thereby enabling high voltage applications, such as, for example, DC/DC power conversion from a high input voltage to a low output voltage. GaN transistors are used in the present disclosure as an exemplary approach to high voltage power management due to the known advantageous characteristics of GaN transistors, such as, for example, a low FOM.

As used in the present disclosure, a low voltage device or low voltage transistor refers to a semiconductor transistor device with a low breakdown voltage which can withstand and block (e.g. in the OFF state) DC voltages (e.g. typically applied between the source and drain terminals of the transistor, or any two of drain, source and gate terminals) less than 10 V and more typically substantially less than 10V, such as less than 3.3-5 V. Some exemplary low voltage devices are complementary metal-oxide-semiconductor (CMOS) transistors.

As used in the present disclosure, the figure of merit (FOM) of a switching transistor (e.g. a transistor which can have a conducting ON state and a non-conducting OFF state), also simply noted as FOM, refers to the product of the ON resistance $R_{on}$ of the transistor and the gate charge $C_g$ of the transistor. A lower FOM can be indicative of a higher switching performance of a transistor. Having a low FOM, especially at high withstand voltages, is a distinctive characteristic of GaN transistors, which are capable of handling up to 100 V with a FOM approximately ten times lower than the FOM of a high voltage MOSFET.

Throughout this description, embodiments and variations of the level shifter are described for the purpose of illustrating uses and implementations of the inventive concept. The illustrative description should be understood as presenting examples of the inventive concept, rather than as limiting the scope of the concept as disclosed herein.

The various embodiments of the present disclosure can be used in applications where control of high voltage devices is desirable using low voltage transistors. Although the exemplary case of DC/DC converters is used to describe the various embodiments of the level shifter according to the present disclosure, such exemplary case should not be construed as limiting the scope of the invention as disclosed herewith. The person skilled in the art is able to use the teachings according to the present disclosure and apply such teachings to specific applications where low voltage control of high voltages is desired.

FIG. 1 shows two stacked GaN transistors, T1 and T2, which can be used as a basis for high voltage stacked GaN transistors. As used in the present disclosure, transistors T1 and T2 can be referred to as, respectively, the low side (LS) transistor and the high side (HS) transistor, and any controlling element associated in controlling the LS transistor and the HS transistor can likewise be referred to as, respectively, the low side (LS) control and the high side (HS) control. In the present disclosure DC/DC conversion serves as an exemplary application for control of stacked high voltage transistors whose teachings can be applied to other applications where stacked transistors control voltages larger than the inherent voltage handling capability of conventional control devices (e.g. using low voltage control transistors). A person skilled in the art will recognize that while the exemplary DC/DC converter using the stacked transistor of FIG. 1 relies on two stacked GaN FETs T1 and T2, the inventive control system disclosed herein can be applied to a stack height of one, as well as to larger stack heights of three, four, or any number of stacked transistors, and to any high voltage transistor made in other materials and/or fabrication processes.

Figure 2:
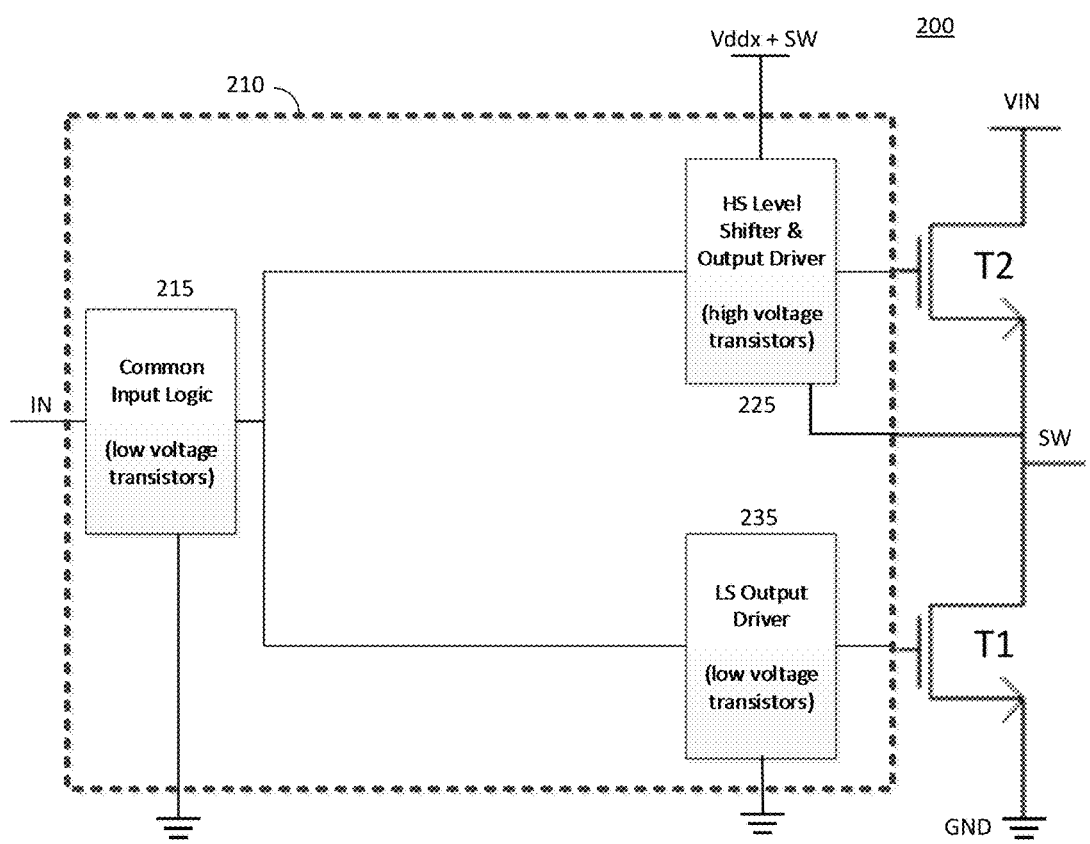
FIG. 2 shows a prior art embodiment of a gate driver circuit used for controlling the low side and the high side of the high voltage stacked transistors of FIG. 1.

FIG. 2 shows a typical prior art embodiment of a gate driver circuit (210) used for controlling the stacked GaN transistors T1, T2 of FIG. 1. Such prior art circuit depicted in FIG. 2 can be used for implementing, for example, a DC/DC converter. The input voltage, $V_{IN}$, shown in FIGS. 1 and 2, applied to the drain of the top transistor T2 (high side transistor) of the stack can be as high as the voltage handling capability of the chosen GaN transistors T1 and T2 (e.g. 20V-100V or higher). As known by a person skilled in the art, based on the input voltage $V_{IN}$, a lower voltage can be generated by controlling the length of time of the ON/OFF states of the two transistors. Such low voltage can be obtained, for example, by filtering a voltage at the common output node SW of the two transistors T1 and T2.

As can be seen in the prior art embodiment of FIG. 2, the source of the lower GaN transistor T1 is tied to a reference ground, GND, and the source of the upper GaN transistor T2 is tied to the drain of T1, which together create an output node SW. Throughout the present disclosure, all circuits or devices associated with (e.g. with controlling) the LS transistor T1 are referred to as low side or LS circuits, devices, or controls, and those associated with the HS transistor T2 are referred to as high side or HS circuits, devices, or controls.

The exemplary prior art circuit shown in FIG. 2 converts the high input voltage $V_{IN}$ to a lower voltage obtained via the output node SW. In one exemplary embodiment $V_{IN}$ can be 40V and the lower voltage obtained via node SW (e.g. via filtering of voltage at node SW) can be about 1.5V. In addition to being able to handle high voltage, it is important for the DC/DC converter of FIG. 2 to exhibit high efficiency in making such a conversion and also doing so at a high frequency. The person skilled in the art readily understands the concept of efficiency in a power conversion application, as well as the desired high frequency conversion which enables use of smaller inductive components in a filter (not shown in FIG. 2) associated to the output node SW. GaN devices provide high efficiency due to their low Ron, as discussed above, while simultaneously switching at high speed due to their low Cg.

The gate driver circuit (210) of the prior art embodiment depicted in FIG. 2 controls the switching of the LS transistor and the HS transistor of the high voltage stacked transistors depicted in FIG. 1 between their respective ON and OFF states to provide a desired voltage, based on the input voltage $V_{IN}$, at node SW. The gate driver circuit (210) controls the switching of the LS transistor T1 and the HS transistor T2 by providing the gate voltages needed to turn ON or OFF each of the two transistors T1 and T2, typically in an alternating fashion, where only one of the two transistors can be ON (or OFF) at any one time. Such gate voltages can be obtained via a feedback loop (not shown) between a filtered voltage based on the voltage at node SW and the input terminal IN to the gate driver circuit (210). The person skilled in the art readily knows that a pulse width modulator (PWM) controlled by the filtered voltage (e.g. at node SW) can be used in such feedback loop to provide low voltage control timing pulses to the gate driver circuit (210). Such low voltage timing pulses can be fed to the input block Low Voltage Transistors logic (215) of the driver circuit (210) of FIG. 2, and subsequently fed to the HS Level Shifter (& Output Driver) (225), which includes high (breakdown) voltage transistors, for conversion to a voltage level adequate to control the gates of the HS transistor T2 of the high voltage stacked transistors of FIG. 1.

In a typical implementation and upon a power up sequence, the gate driver circuit (210) of the prior art embodiment depicted in FIG. 2 can initially turn off either the high side transistor (T2) or both of the high side and the low side transistors (T1, T2) to ensure that both T1 and T2 are in a safe OFF state while all other DC/DC converter associated circuitry stabilizes upon the power-up. Subsequently, the gate driver (210) can control a DC voltage conversion (e.g. $V_{IN}$ to SW) by initially turning on the low side (LS) transistor T1 by driving its gate voltage above its threshold voltage while turning OFF the high side (HS) transistor T2. This brings the voltage at node SW to GND since T1 is conducting and therefore its $V_{DS}$ can be very close to zero. Also, since the source of T2 is close to GND, the HS transistor T2 holds off all of the $V_{IN}$ voltage applied to its drain (e.g. its $V_{DS}=V_{IN}$).

Alternatively, when the gate driver (210) of the prior art embodiment depicted in FIG. 2 turns OFF LS transistor T1 and turns ON the HS transistor T2 of FIG. 2, the output node SW is charged high toward the voltage $V_{IN}$. Since the HS transistor T2 is conducting and the LS transistor T1 is not conducting, during the ON period (e.g. length of time of ON state) of the HS transistor T2, the output node SW will have a nominal voltage equal to $V_{IN}$, other than during a corresponding charging and discharging period at the beginning and end of the ON period. During the ON period of T2, the gate voltage of HS transistor T2 stays positive (e.g. by a voltage equal to Vddx as provided by the Vddx+SW supply to the HS transistor T2 controlling block (225)) with respect to the voltage at the output node SW such as to keep the HS transistor T2 ON and conducting strongly (e.g. Vddx≥$V_{th}$ of T2, where Vth is the threshold voltage of HS transistor T2), thereby keeping the voltage at node SW at $V_{IN}$. Hence the driving nodes in the gate driver controller circuit (210) connected to node SW can withstand voltages with respect to GND up to the voltage $V_{IN}$, and potentially even higher when transient charging and resonance effects, as known to the person skilled in art, are included. For example, when HS transistor T2 is ON, voltage at node SW (e.g. source of T2) equals $V_{IN}$ and the gate of the HS transistor T2 can be at approximately $V_{IN}$+Vddx, such as to turn T2 ON (e.g. Vddx≥$V_{th}$ of T2, where Vth is the threshold voltage of HS transistor of T2). Hence somewhere within the HS level shifter (& output driver) (225) module of FIG. 2 where control timing pulses are provided to the gate of the HS transistor T2 via high voltage transistor devices, the high $V_{IN}$ voltage is dropped; that is, there is an active device within the module (225) which sees the high $V_{IN}$ voltage across two of its terminals. In the prior art gate driver (210) depicted in FIG. 2, such high voltage is handled by the high voltage transistors inside the HS level shifter (& output driver) (225) module of FIG. 2.

The high (breakdown) voltage transistors used in the prior art gate driver circuit (210) of FIG. 2 which are used to control the HS transistor T2 can be transistors such as high voltage MOSFETs, bipolar, HEXFETs, LDMOS, or other types of (control) transistors known to the person skilled in the art. Such high voltage transistors can have an FOM and other switching characteristics that do not match the characteristics of the GaN FETs of the LS transistor T1 and HS transistor T2 used in the high voltage stack depicted in FIG. 1. For example, their FOMs can be up to 10 times worse (higher) than the FOM of the GaN FETs T1 and T2. Therefore, much of the benefit of the GaN FETs of the exemplary prior art circuit depicted in FIG. 2 can be lost due to the lower performance characteristics of the high voltage transistors controlling the GaN FETs (LS transistor T1 and HS transistor T2). Such high voltage transistors can be expensive compared to low voltage transistors. Furthermore, each of the mentioned type of high voltage transistors may have other features such as cost, availability or complexity that could make it undesirable in certain high voltage applications.

It can therefore be desirable to control the high voltage GaN FETs with low voltage devices such as, for example, standard Si MOSFETs. By using low voltage MOSFETs, low cost, high precision and high volume CMOS manufacturing techniques can provide the necessary control while keeping the performance advantages provided by the GaN FET transistors, thereby eliminating the need for more exotic, high voltage transistors in the control circuit (e.g. gate driver). It can also be desirable to use low voltage MOSFETs in the control circuits because single chip embodiments are enabled as additional control or signal processing capabilities can be integrated within a same chip. The person skilled in art can appreciate such integration as single chip devices (e.g. monolithic integration) typically offer the most reproducible solutions possible in the electronics arts.

According to an aspect of the present disclosure systems, devices and methods are provided to enable such an integrated control system for controlling high voltage devices using exclusively low (breakdown) voltage transistors. According to one exemplary embodiment of the present disclosure later described, low voltage (e.g. less than 5 V) SOI MOSFETs can be used to create a gate driver circuit capable of controlling GaN FETs operating with a $V_{IN}$ voltage of 20-100V or above. In particular, a novel level shifter circuit is presented which when integrated in the gate driver circuit can enable such gate driver circuit to operate using only low voltage transistors. In other words, the level shifter according to the various embodiments of the present disclosure can drop the high $V_{IN}$ voltage without impressing that high voltage on any transistors.

Figure 3A:
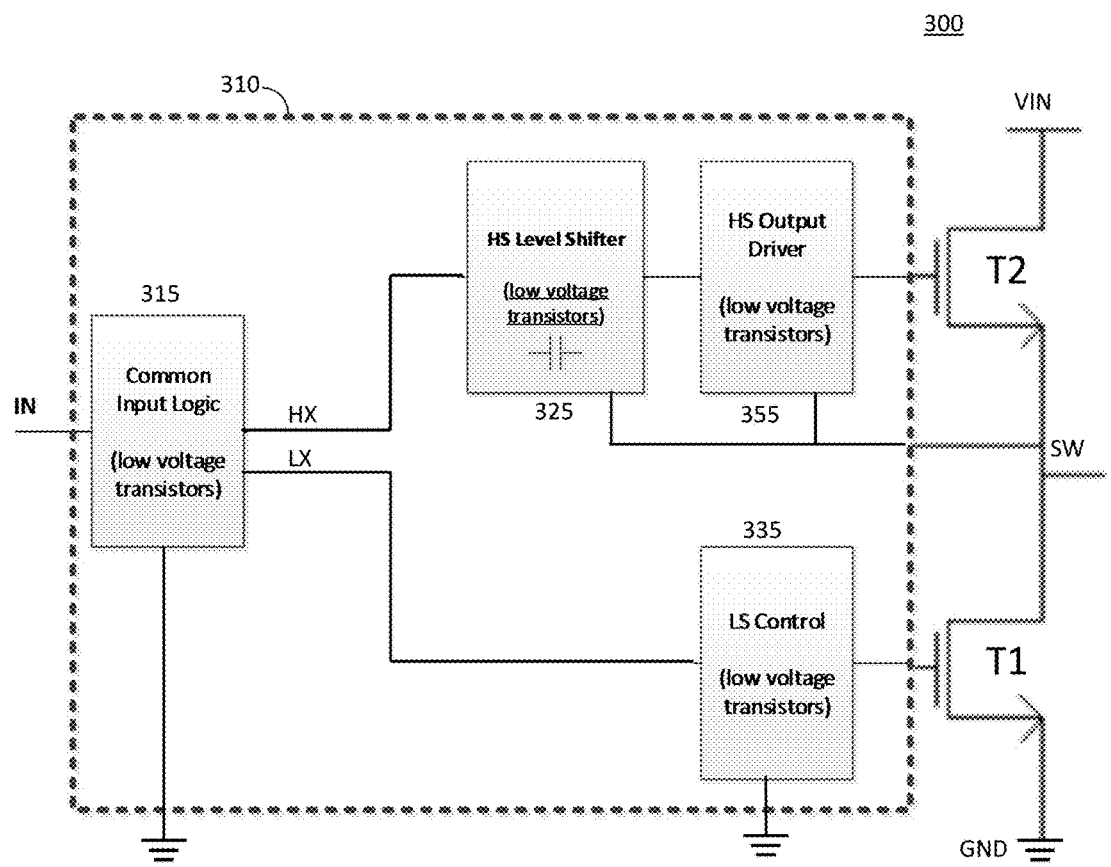
FIG. 3A shows a block diagram of a gate driver circuit according to an embodiment of the present disclosure which can be used to control the low side and the high side of the high voltage stacked transistors of FIG. 1. The gate driver circuit of FIG. 3A comprises an HS level shifter, which according to an embodiment of the present disclosure, can control high voltage devices by using only low voltage transistors. In the exemplary implementation depicted in FIG. 3A, the HS level shifter is used to control the high side transistor of the high voltage stacked transistors of FIG. 1.

FIG. 3A shows a block diagram of a gate driver circuit (310) according to an embodiment of the present disclosure which can be used to control the LS transistor T1 and the HS transistor T2 of the high voltage stacked GaN transistors of FIG. 1. In contrast to the prior art gate driver circuit (210) of FIG. 2 where a HS level shifter (225), using high voltage transistors, is used to handle the high voltage drop associated with the high voltage $V_{IN}$, the gate driver (310) uses an innovative HS level shifter (325) according to an embodiment of the present disclosure to perform the same high voltage drop task without using high voltage transistors. In all blocks (315, 325, 335, 355) of the gate driver (310) shown in FIG. 3A, including the HS level shifter (325), all constituent transistors handle only low voltages, e.g. between their sources and drains, and therefore low breakdown voltage transistors can be used for implementing such gate driver (310). As can be seen in the block diagram of FIG. 3A, the gate driver (310) according to an embodiment of the present disclosure, can include a common input logic circuit (315), high side control circuits (325, 355) and a low side control circuit (335). As will be described below, embodiments of the current disclosure couple the input low voltage (timing) control signals (e.g. provided at the input IN terminal of the gate driver circuit (310) and further processed via the common input logic circuit (315)) to the high side control circuits (e.g. 325, 355) through capacitors which can block the high voltage. Such coupling can allow dielectric isolation between circuits on a same die, with high voltage circuits used, for example, in the HS control blocks (325, 355), operating with respect to a reference potential (e.g. voltage at node SW) which can be significantly larger than the reference potential (e.g. GND) used in the low voltage circuits used, for example, in the LS control circuit (335) and the common input logic block (315). A person skilled in the art readily recognizes that magnetic coupling or optical coupling between the low voltage and high voltage domains (e.g. circuits) can also be utilized in place of the capacitive coupling. In general any type of coupling that can provide galvanic isolation (non-galvanic coupling) between the low voltage and high voltage circuits can be used in the embodiments according to the present disclosure. Capacitive coupling can be both cheaper and easier to integrate into single chip solutions than alternate couplings. For these reasons, several embodiments of the present disclosure describe capacitive coupling as a preferred embodiment.

Figure 3B:
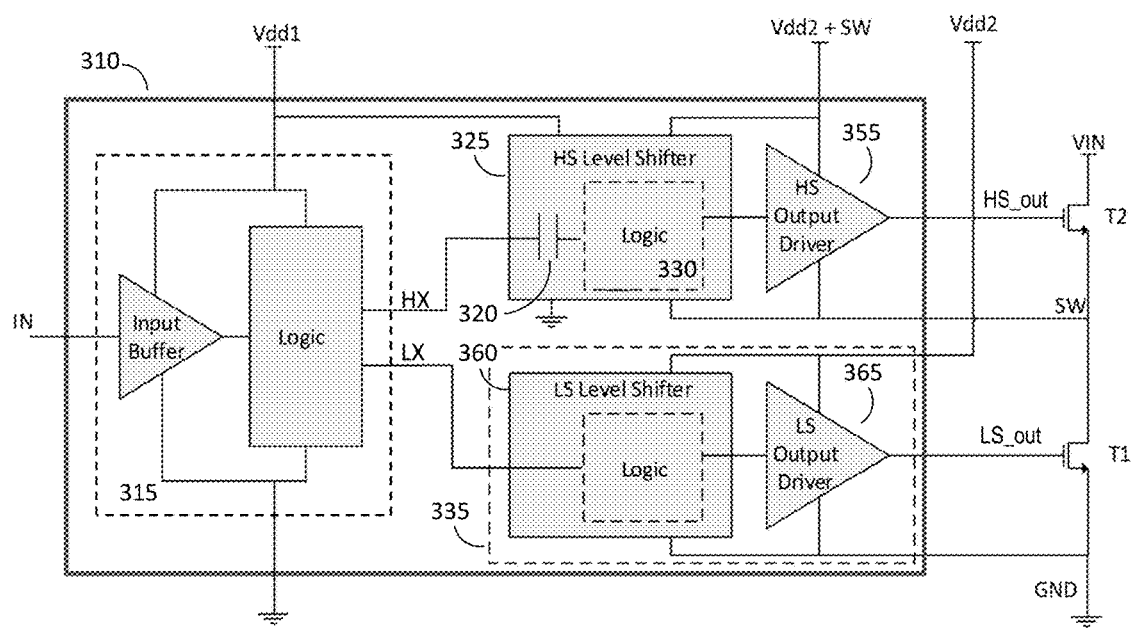
FIG. 3B shows a more detailed version of the gate driver circuit of FIG. 3A, including a more detailed representation of the HS level shifter of the gate driver circuit which is used to control the high side transistor of the high voltage stacked transistors of FIG. 1.

FIG. 3B shows a more detailed version of an exemplary embodiment according to the present disclosure of the gate driver circuit (310) of FIG. 3A. In particular, capacitive coupling within the HS level shifter (325) is shown, which capacitive coupling (320) is used to decouple the DC content between the HS level shifter (325) and the common input logic circuit (315) while providing relevant control timing information associated to the input signal IN to the HS level shifter circuit (325). Such control timing information can subsequently be processed by circuitry, including logic circuitry, in the Logic block (330) of the HS level shifter (325). Furthermore, FIG. 3B shows the supplies and reference potentials to the high side control circuits (325, 355), the low side control circuit (335), the common input logic circuit (315) and the LS transistor T1 and the HS transistor T2 of the high voltage stacked transistors of FIG. 1. As can be seen in FIG. 3B, the common input logic circuit (315), and the low side control circuits composed of the LS level shifter (360) and the LS output driver (365) are provided with a low voltage supply Vdd1 and a reference potential GND (e.g. reference zero volts), whereas the high side control circuits (325, 355), composed of the HS level shifter (325) and the HS output driver (355), are provided with a supply voltage Vdd2+SW and a reference potential SW, where the reference potential SW is the voltage at the common node SW and can be up to a high voltage $V_{IN}$ above the reference potential GND of the low voltage circuits (note that the HS level shifter circuit (325) can additionally be provided with Vdd1 and GND as depicted in FIG. 3B and explained in later sections of the present disclosure). Therefore, the low voltage transistors used in the low side circuits (controlling the LS transistor T1) and the low voltage transistors used in the high side circuits (controlling the HS transistor T2) of the gate driver (310) can be subjected to a low voltage excursion equal Vdd1 or Vdd2. It should be noted that both Vdd1 and Vdd2 represent low voltage supplies which can be same or different. Furthermore, for simplicity reasons, the supply voltage Vdd2+SW provided to the high side control circuits described in the present disclosure can be annotated as $V_{DD}$, such as $V_{DD}$=Vdd2+SW.

As can be seen in FIG. 3B, the input signal IN to the gate driver (310) can be processed by the common input logic circuit (315) of the gate driver (310) and generate two signals, LX and HX, where the LX signal can be fed to the low side control circuit (335) of the gate driver (310), composed of the LS level shifter (335) and the LS output driver (365), to generate a control signal for the gate of the low side transistor (T1); and the HX signal can be fed to the high side control circuits (325, 355) of the gate driver (310), composed of the HS level shifter (325) and the HS output driver (355), to generate a control signal for the gate of the high side transistor (T2). The HS output driver (355) outputs a signal HS_out, which has the required amplitude and drive strength (e.g. current) to drive the high side transistor (T2). The HS_out signal output by the HS output driver (355) contains the same timing information as provided by its input signal, the input signal being provided by the Logic block (330) of the HS level shifter (325). According to some embodiments of the present disclosure, signals LX and HX can be a same signal, except for a desired delay, and therefore can contain the same timing information.

Figure 4A:
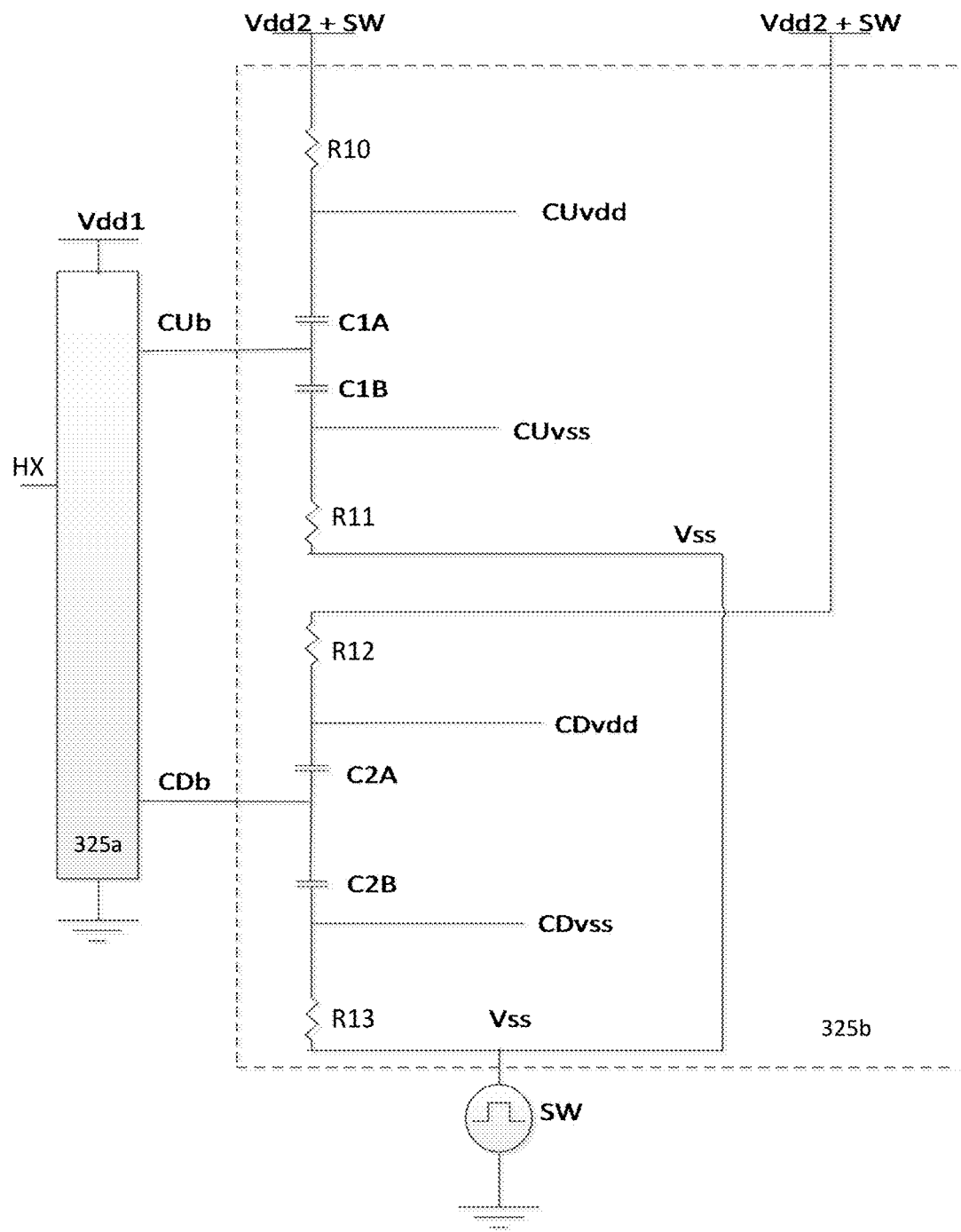
FIG. 4A shows a circuital representation of an input stage of the HS level shifter according to an embodiment of the present disclosure depicted in FIGS. 3A-3B, where capacitive coupling is used to provide control information to the HS level shifter.
Figure 4B:
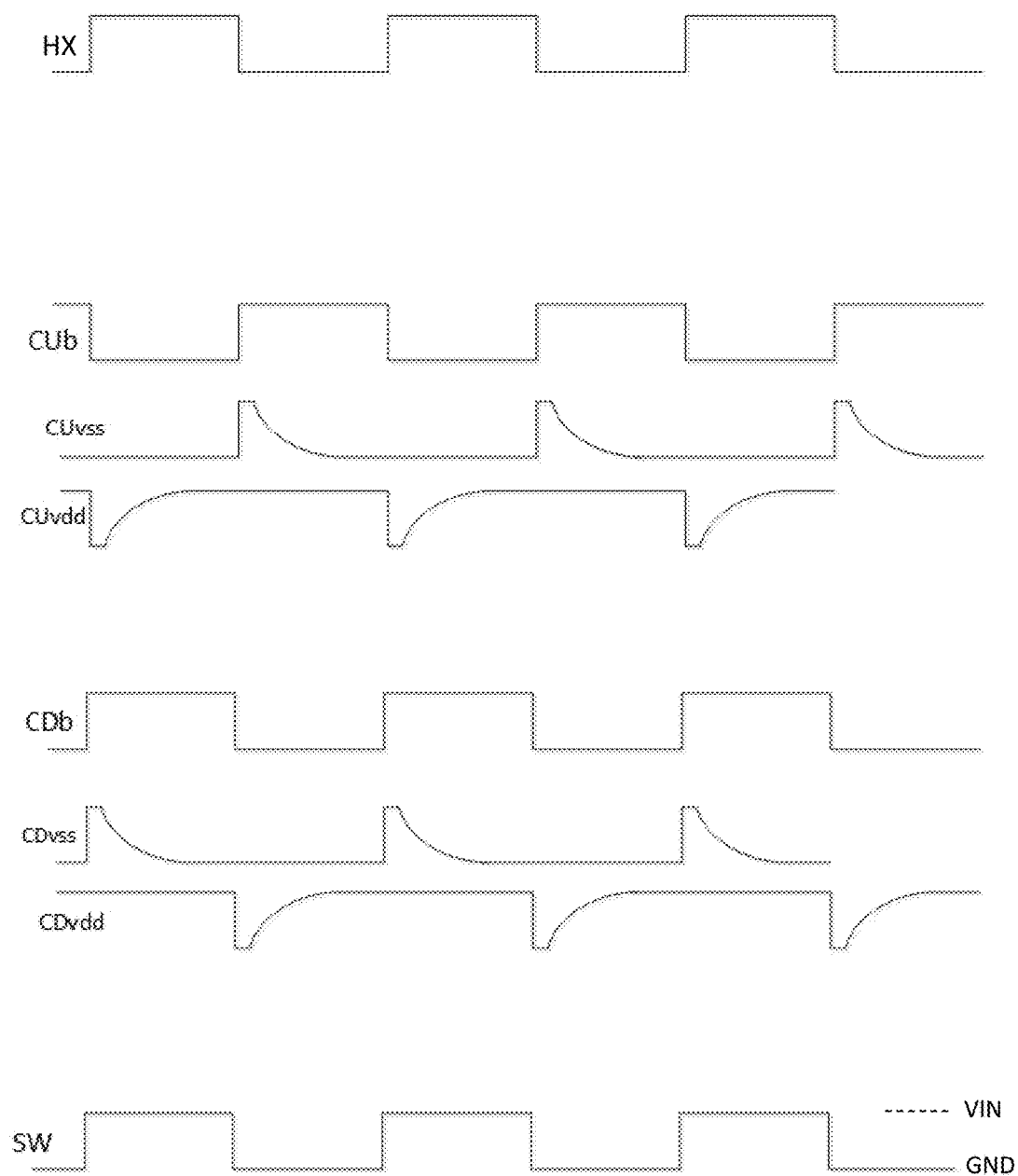
FIG. 4B shows timing diagrams of signals at various nodes of the HS level shifter depicted in FIG. 4A.

FIG. 4A shows a circuital representation of an input stage of the HS level shifter (325) of FIGS. 3A-3B according to an embodiment of the present disclosure, and FIG. 4B depicts timing diagrams of various signals of the circuit represented in FIG. 4A. As can be seen in FIG. 4A, the input stage of the HS level shifter (325) can comprise an input signal conditioning portion (325a), which can operate between Vdd1 and GND, generating two complementary signals, Cub and CDb, based on the input signal HX, and a capacitive signal decoupling portion (325b) which can operate between Vdd2+SW and SW and whose functional description is provided in the following sections of the present disclosure. It should be noted that although the circuit (325a) is shown as part of the HS level shifter (325), according to some embodiments of the present disclosure, circuit (325a) can be separate from (325) and even part of circuit (315).

The HS level shifter circuit, whose input section is represented in FIG. 4A, can allow a low voltage circuit (e.g. (315) of FIGS. 3A-3B) to control and operate high voltage control circuits (e.g. via T1, T2 and $V_{IN}$) and can be further referred to in the present disclosure as a low voltage transistor level shifter (LVTLS), or "level shifter". In the particular implementation of FIGS. 3A-3B where such level shifter controls operation of the high side (HS) transistor (T2), the level shifter can be referred to as HS-LVTLS, or simply as the HS level shifter. The level shifter of FIG. 4A allows for signals to be driven between elements that are separated by high voltages (e.g. $V_{IN}$), meaning the low voltage signals have their DC reference (e.g. reference potential) level shifted up or down along with the common node SW. This is schematically represented in FIG. 4A by a switching reference potential SW (feeding a reference line labelled $V_{SS}$), which as described in earlier sections of the present application can switch between $V_{IN}$ and ground (GND) as a function of the alternating ON/OFF states of transistors T1 and T2.

According to further embodiments of the present disclosure, the level shifter represented in FIG. 4A (except the input portion (325a) of the level shifter) can float up and down with the level of the reference potential SW (=$V_{SS}$) and can be isolated from GND (e.g. reference potential of the low voltage circuits of FIGS. 3A-3B and (325a)). This can allow the level shifter to operate using its constituent low breakdown voltage transistors in spite of high voltage excursions of 20-100V or more at the reference potential SW (=$V_{SS}$) with respect to the reference potential GND. During operation of the level shifter, the constituent low voltage transistors are subjected to internal voltage excursions (e.g. at their source, gate and drain terminals) not larger than a low voltage supply (e.g. Vdd2 of FIG. 3B). Capacitive isolation between the common input logic circuit (315) and the HS level shifter circuit (325, 355), as described in the prior sections of the present disclosure, can be provided by capacitors $C_{1A}$, $C_{1B}$, $C_{2A}$ and $C_{2B}$ of FIG. 4A (later described).

According to an exemplary embodiment of the present disclosure the level shifter (e.g. HS level shifter, LS level shifter) is fabricated, in its entirety or partially, in Silicon on Insulator (SOI) CMOS with an SOI substrate capable of withstanding the maximum DC voltage (e.g. $V_{IN}$ 20-100 V in this example) excursion at the reference potential SW with respect to the GND without conducting current or breaking down. According to a further exemplary embodiment of the present disclosure, the level shifter can be fabricated, in its entirety or partially, using silicon on sapphire (SOS) fabrication technology, as described, for example, in U.S. Pat. No. 5,416,043, issued on May 6, 1995, and in U.S. Pat. No. 5,600,169, issued on Feb. 4, 1997, whose disclosures are included herein by reference in their entirety. According to further exemplary embodiments of the present disclosure, fabrication technologies which can provide junction isolation between low voltage active circuits (e.g. transistors) and the corresponding substrate can also be used to fabricate the level shifter. The person skilled in the art will recognize that bulk silicon (Si) can provide such junction isolation between low voltage active circuits and the substrate.

With further reference to FIG. 4A, operation of the HS level shifter (325) according to the various embodiments of the present disclosure is described using the corresponding timing diagram of FIG. 4B. Signal HX of FIG. 4B represents an input timing control provided to the single-ended input terminal HX of a low voltage circuit (e.g. (325a) of FIG. 4A). The signal HX can be represented by a square wave signal (e.g. of a same or different duty cycle) which can be derived, for example, from a pulse width modulator (not shown but easily understood by a person skilled in the art to be to the left of IN input terminal in FIGS. 3A-3B). Signal HX is converted, within the input stage circuit (325a) of the HS level shifter (325), from a single-ended signal to a differential signal represented by CUb and CDb in FIGS. 4A-4B, with CDb being an inverse, or logic NOT function, of CUb. The reason for creating the differential, and inverted, form of the HX signal is described below. It should be noted that although the following sections will assume that signals CUb and CDb are inverted versions of one another, according to further exemplary embodiments of the present disclosure, such signals can include a time shift (e.g. delay), such as one is an inverted and time shifted version of the other. The time shift can be used, for example, to compensate for differences in propagation delays between paths taken by the two signals Cub and CDb.

As can be seen by considering both the circuit diagram of FIG. 4A and the timing diagram of FIG. 4B, CUb is applied between capacitors C1A and C1B and CDb is applied between capacitors C2A and C2B. It should be noted that the positive edge of CUb aligns with the negative edge of CDb.

At the positive edge of CUb, a positive pulse signal is induced at nodes CUvss and CUvdd. Since prior to the induced positive pulse signal, node CUvss is at a low level (i.e. $V_{SS}$=SW), the positive pulse signal induced at node CUvss brings the node to the high level (i.e. between $V_{SS}$=SW and $V_{DD}$=Vdd2+SW). At the same time, since prior to the induced positive pulse signal, node CUvdd is at a high level, the positive pulse signal induced at node CUvdd attempts to increase the level above $V_{DD}$=Vdd2+SW, but the Vdd2 power supply limits its size. Therefore, the positive edge of CUb causes CUvss to transition from lower (SW) to higher ($V_{DD}$) level, but CUvdd stays at a high level. According to various embodiments of the present disclosure described in the following sections, the CUvss transition between the lower level (SW) and the higher level (Vdd2+SW) can be used to trigger digital circuitry that latches the timing of CUb. It should be noted that pull-up resistors, R10, R12, and pull-down resistors R11, R13, provide steady-state voltage levels to the signals at nodes CUvdd, CDvdd, CUvss and CDvss respectively. As depicted in the timing diagram of FIG. 4B, the appropriate edge of the signals CUb and CDb will cause the voltages at these nodes to transition to the opposite state. Selection of the values of resistors R10-R13 can be made based on a number of design constraints, such as, for example; a desired value of an associated RC time constant provided by the combination of a resistor R10-R13 at a node CUvdd-CDvss and a corresponding capacitor C1A-C2B, a desired signal level at nodes CUvdd-CDvss, and a desired physical size of capacitors C1A-C2B. The person skilled in the art readily knows how to select the values of the capacitors C1A-C2B and resistors R10-R13 given specific design constraints.

Aligned with the positive edge of CUb is the negative edge of CDb, and therefore at the same time that the positive pulse signal is induced at nodes CUvss and CUvdd, a negative pulse signal is induced by CDb at nodes CDvss and CDvdd, thus creating signals at those nodes which are complementary to signals created at nodes CUvss and CUvdd. As can be seen in the corresponding timing diagram of FIG. 4B, such complementary signals have the same shape, but go in opposite directions (inverted signals) and start at either $V_{DD}$ (=Vdd2+SW) or $V_{SS}$. For example, signals at nodes CUvss and CDvdd are complementary (e.g. inverted) as well as signals at nodes CUvdd and CDvss. Also, for example, at the leading edge of CUb, signal at node CUvss switches from $V_{SS}$ to $V_{DD}$ and subsequently gradually discharges to $V_{SS}$, and at the trailing edge of CUb, signal at node CUvdd switches from $V_{DD}$ to $V_{SS}$ and subsequently gradually charges to $V_{DD}$.

It should be noted that the signals represented in the timing diagram of FIG. 4B can have different DC offsets corresponding to the reference potential where a corresponding circuit operates. For example, signals HX, CUb and CDb have a zero DC offset since the corresponding circuits operate with respect to the reference potential GND, whereas signals CUvss, CUvdd, CDvss and CDvdd have a DC offset equal to the level of SW, since the corresponding circuit (e.g. HS level shifter) operates with respect to the reference potential $V_{SS}$=SW. The CDvdd transition generate similarly to CUb but in the opposite direction. Therefore, the signal at node CDvdd has a transition from a high level (Vdd2+SW) to a low level (SW) that can be latched by subsequent circuitry. The reason for creating complementary transition is described below. It should be further noted that all signals shown in FIG. 4B (as well as in FIGS. 5B and 7B later described) have low voltage swings (such as being bounded by $V_{SS}$ and $V_{DD}$) except for signal at node SW, which has a HI level of $V_{IN}$ and a LOW level of GND, as indicated in FIG. 4B.

The complementary signals at nodes CUvss, CDvdd and CUvdd, CDvss eliminate false triggers caused by either the rising or falling level of the $V_{SS}$ reference (and therefore of the $V_{DD}$ as well, since $V_{SS}$=SW, and VDD=Vdd2+SW) by providing two complementary (inverted) pulses for each transition of signal HX which includes timing information. For example, complementary (inverted) pulse signals at nodes CUvss and CDvdd each represent timing information on the falling edge of the signal HX, whereas complementary (inverted) pulse signals CUvdd and CDvss each represent timing information on the rising edge of the signal HX.

During time periods when $V_{SS}$ is either rising or falling between $V_{IN}$ and GND, charging currents can be induced through capacitors C1A-C2B and therefore generate undesired positive or negative pulse signals at nodes CUvdd-CDvss. As will be seen in the following sections of the present disclosure, the pulse signals at nodes CUvdd-CDvss trigger additional logic that subsequently controls the high side GaN transistor T2. Therefore, any undesired (e.g. false) pulses can cause errors in the control signals which in turn can prevent proper control of the high side transistor which in turn can cause erroneous output voltage and degrade device reliability. By choosing both an upward and downward pulse (e.g. differential signal), and requiring both an upward and downward pulse to trigger a subsequent latch (as described in FIG. 7A through transistors M2-M5), the pulses derived from the HX signal (HX being derived from the IN signal) can be distinguished from the (false) pulses caused by rising or falling levels of $V_{SS}$.

As seen in FIG. 4B, on rising edges of the HX signal, CUvss and CDvdd appear not to generate any pulses, and on falling edges of the HX signal, CUvdd and CDvss appear not to generate any pulses. In reality, during such transitions, some pulses may arise (for example, on a rising edge of the HX signal, at node CUvss, a small pulse signal going below the $V_{SS}$ level (i.e. SW) can be observed, and on a falling edge of the HX signal, at node CUvdd, a small pulse signal going above the $V_{DD}$ level (i.e. Vdd2+SW) can be observed). It follows that according to an embodiment of the present disclosure a clamp circuit (e.g. FIG. 6 later described) can be used to clamp and control such pulses rather than have them deliver charge (and therefore waste power) to $V_{SS}$ or $V_{DD}$.

Therefore, the level shifter according to the embodiment of the present disclosure converts the input signal square wave represented by HX in FIG. 4B, to complementary pulse signals at nodes CUvss, CUvdd, CDvss and CDvdd with corresponding pulse shapes and timings as shown in FIG. 4B. These complementary pulses track the timing information provided by the input signal at IN (leading and trailing edges of IN) while being at a DC level equal to SW which defines $V_{SS}$. For example, such complementary pulses have a DC level equal to $V_{IN}$ when $V_{SS}$ is at $V_{IN}$ and have a DC level equal to GND when $V_{SS}$ is at GND. Hence, a person skilled in the art will recognize that the HS level shifter (325) according to various embodiments of the present disclosure drops the $V_{IN}$ high voltage across capacitors C1A, C1B, C2A and C2B.

It is pointed out that the pulse signals at CUb and CDb have a magnitude of a low voltage Vdd2 (e.g. in the range of 0-5 V and typically 0-2.5V) while the pulses CUvss, CUvdd, CDvss and CDvdd have a magnitude which can range between $V_{SS}$ and $V_{SS}$+Vdd2=SW+Vdd2=$V_{DD}$. Hence, no transistor within the gate driver circuit (310) using the described HS level shifter circuit handles the $V_{IN}$ high voltage across itself (e.g. between its drain and source terminals), in sharp contrast to prior art solutions in which high (breakdown) voltage transistors are used in place of the capacitive level shifter (HS level shifter (325)) according to the present embodiments. In the previously described embodiment according to the present disclosure where SOI MOSFETs are used as the low voltage transistors, the $V_{IN}$ high voltage is also handled by the insulating SOI substrate layer.

As can be seen by the pulse shapes in FIG. 4B, pulses generated at nodes CUvss, CUvdd, CDvss and CDvdd have long tails caused by the RC nature of the associated circuitry (due, for example, to R10, C1A, R11, C1B, R12, C2A, R13, C2B) with corresponding RC time constants. In some embodiments, it can be desirable to enable pulses as close together as possible, thereby enabling the largest ratio (i.e. duty cycle) between ON/OFF or OFF/ON at the input IN of the gate driver circuit (310) of FIG. 3B, such as generated, for example, by a pulse width modulator (PWM). However, the long tails of the pulses at nodes CUvss, CUvdd, CDvss and CDvdd can prevent obtainment of such large ratio. In the next paragraphs, a further embodiment of the present disclosure will be presented, where such tails are shortened using discharge transistors M6-M9 as depicted in FIG. 5A.

Figure 5A:
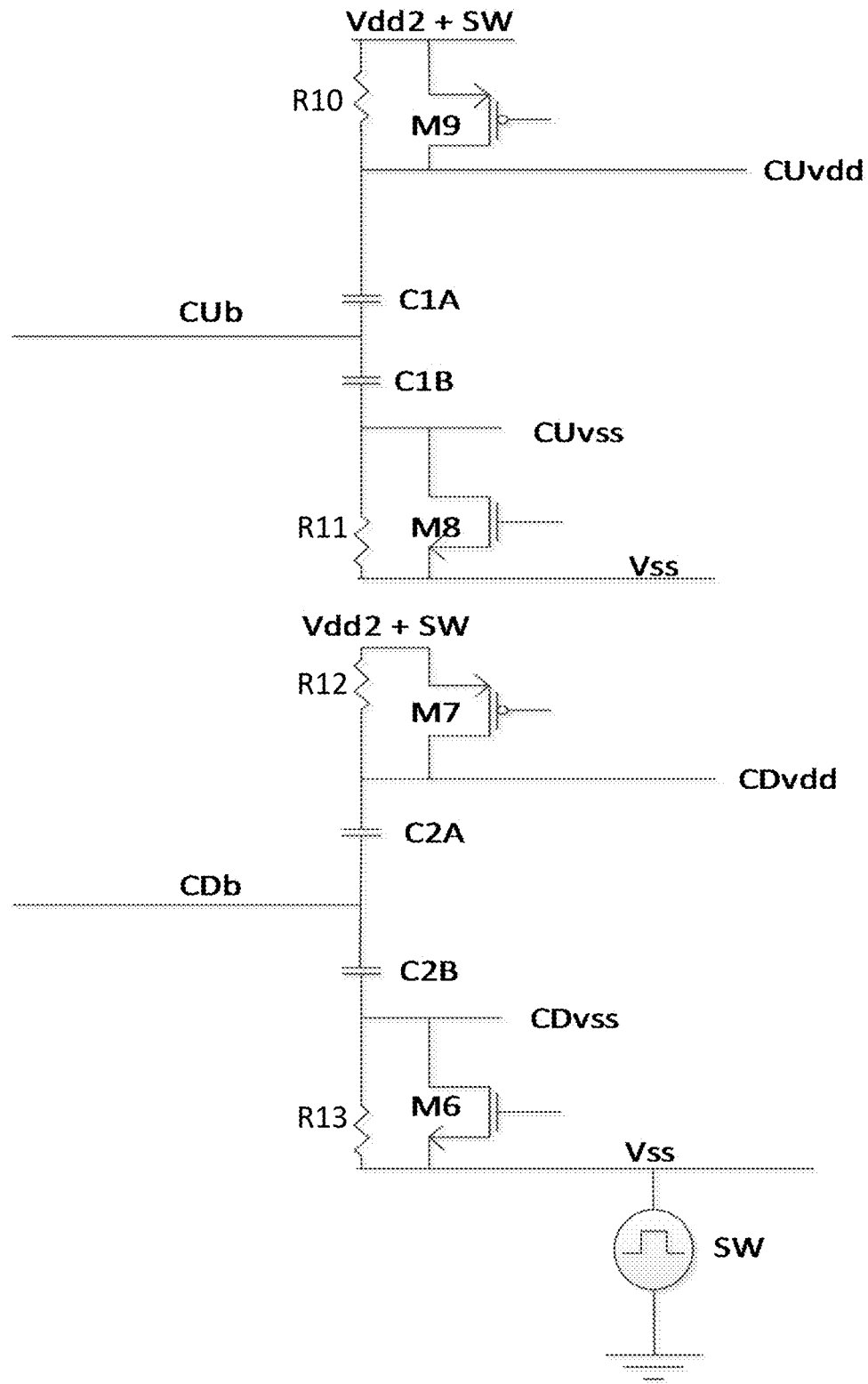
FIG. 5A shows additional circuitry to the HS level shifter of FIG. 4A, which according to an embodiment of the present disclosure can eliminate the tails of the pulses created at the various nodes of the low voltage level shifter.

FIG. 5A shows additional circuitry to the HS level shifter (325) of FIG. 4A, which according to an embodiment of the present disclosure can shorten the tails of the pulses created at nodes CUvss, CUvdd, CDvss and CDvdd and therefore can allow for shorter time between pulses. This is done by adding discharge transistors M6-M9 which are configured to short the isolation capacitors C1A-C2B either to $V_{SS}$ or to $V_{DD}$, thereby discharging any residual voltage tail they may have at the time of shorting (and therefore not discharged through a corresponding resistor R10-R13). For example, when discharge transistor M9 is turned on, it shortens node CUvdd to $V_{DD}$, thereby bypassing discharge via resistor R10, and when discharge transistor M6 is turned on, node CDvss is shorted to $V_{SS}$, and thereby bypassing discharge via resistor R13.

Figure 5B:
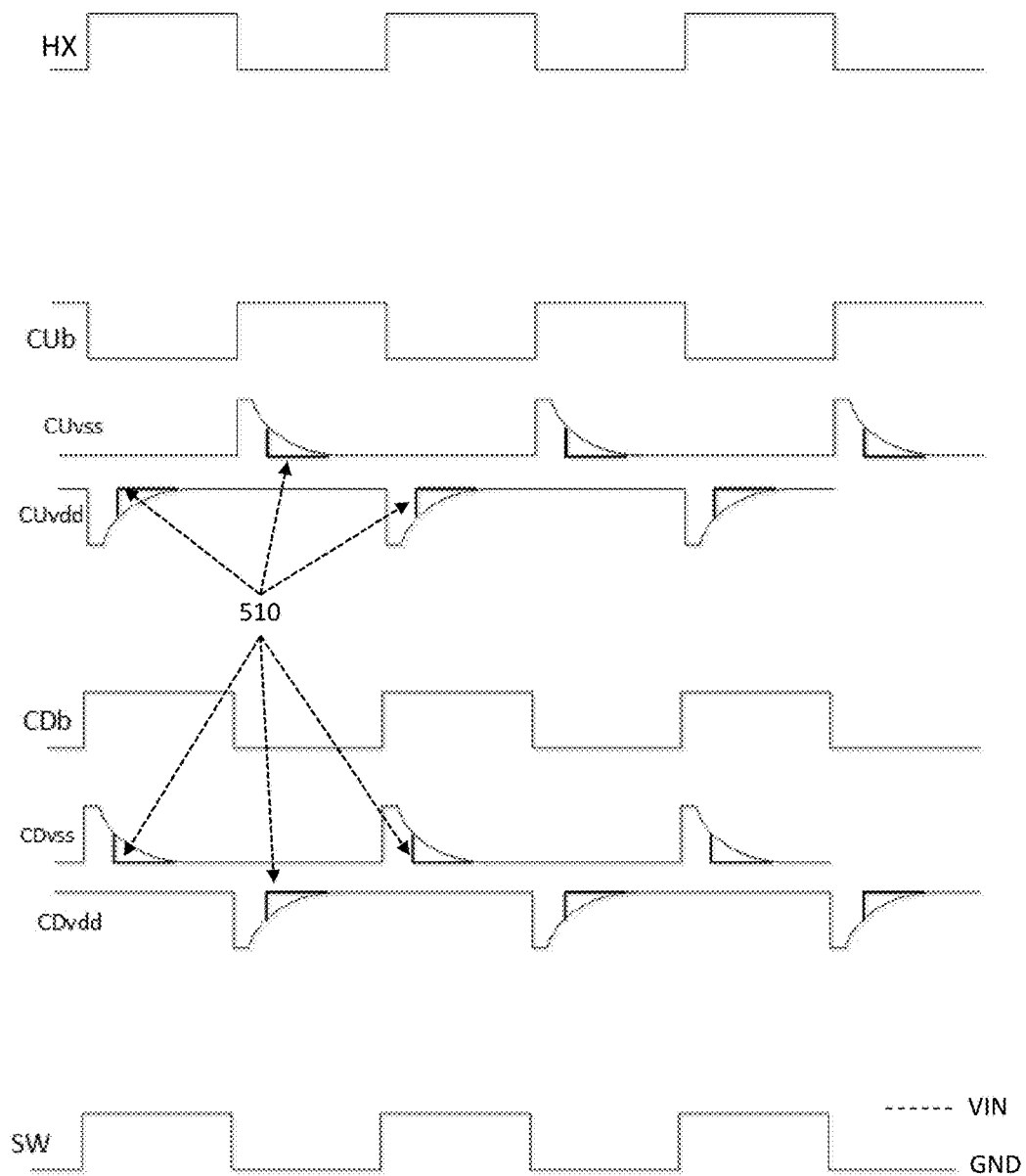
FIG. 5B shows timing diagrams of signals at various nodes of the HS level shifter depicted in FIG. 5A, where the additional circuitry removes the tails of the pulses.
Figure 8:
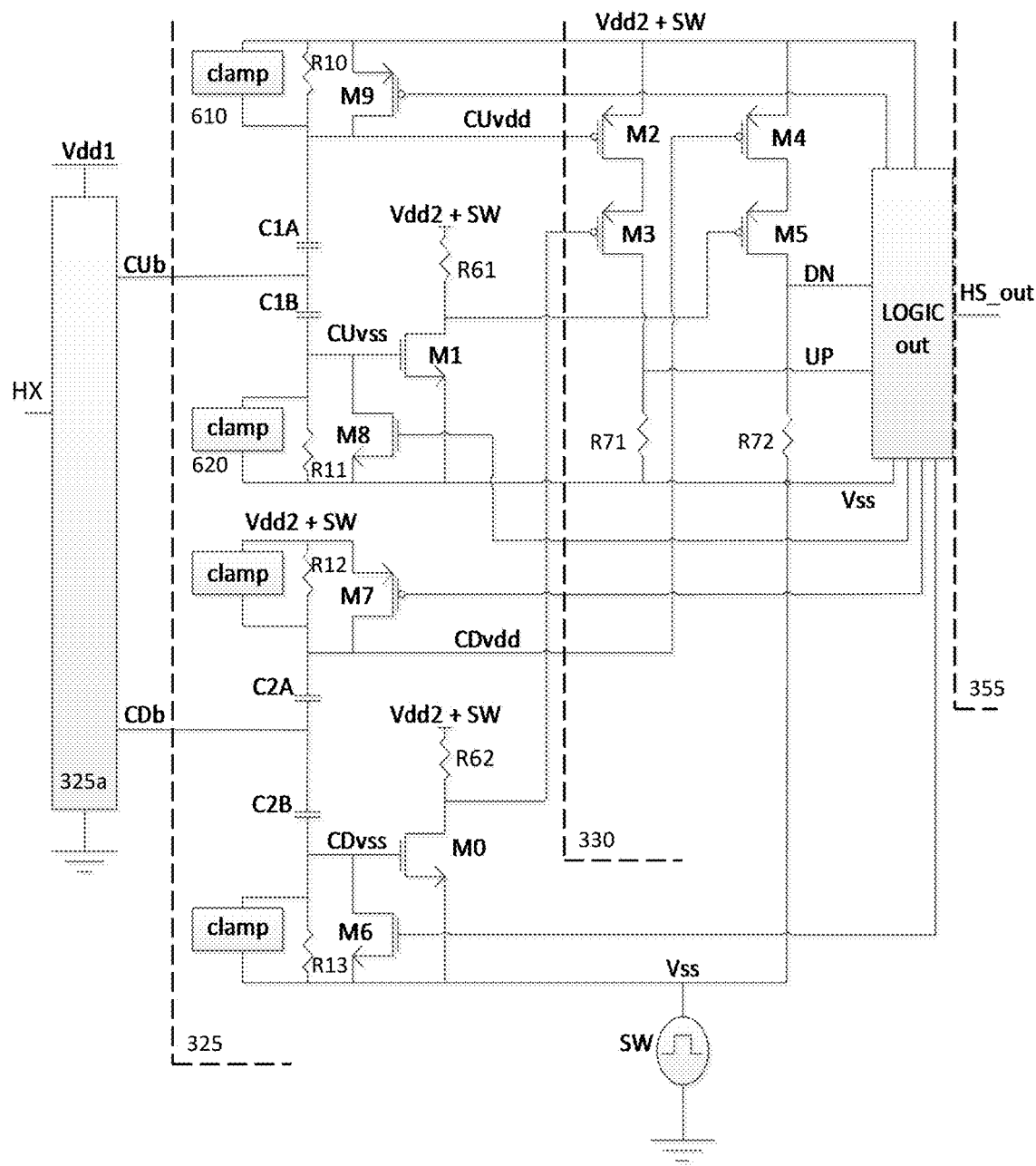
FIG. 8 shows a detailed circuital implementation of the various modules of the gate driver circuit of FIG. 3A used to control the high side high voltage transistor T2 of the stack depicted in FIG. 1.

The impact of the discharging transistors M6-M9 on the shapes of the pulses at nodes CUvss, CUvdd, CDvss and CDvdd can be seen as the bold lines (510) in FIG. 5B. As can be seen, such pulses keep their original shape (following an RC time constant associated to a corresponding capacitor-resistor pair C1A-C2B, R10-R13) until the discharge transistors are triggered after a certain period of time from the start a pulse, and then the voltages on CUvss, CUvdd, CDvss and CDvdd return to either $V_{SS}$ or $V_{DD}$, as shown by the bold lines in FIG. 5B. Although not shown in FIG. 5A, control signals to the discharge transistors M6-M9 can be provided at the gates of the discharge transistors. Such control signals can be generated, for example, in subsequent circuitry, such as circuitry contained in the LOGIC_out block of the Logic block (330) as depicted in FIG. 8.

Figure 6A:
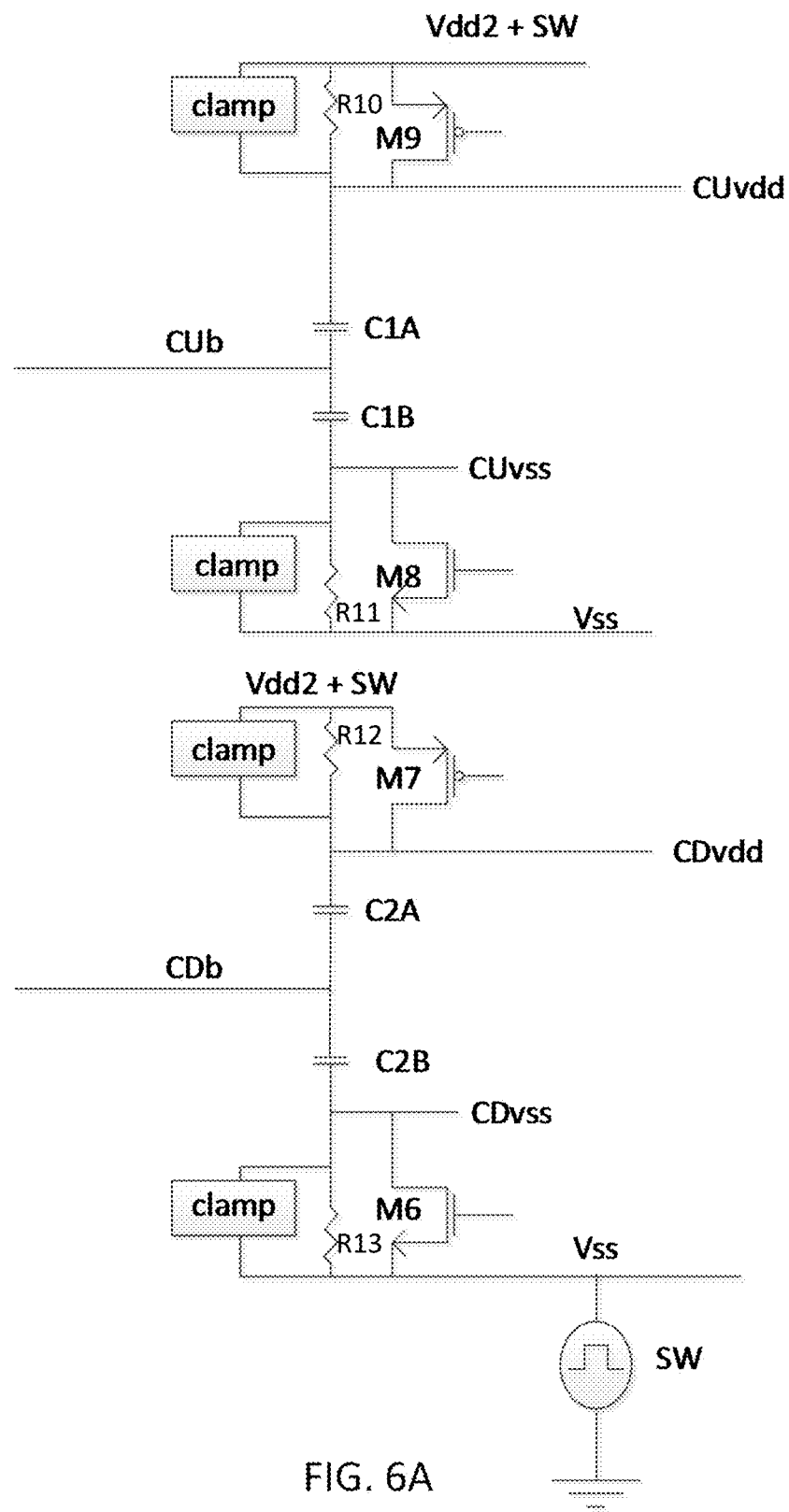
FIG. 6A shows a clamping circuitry added to the HS level shifter of FIG. 5A, where such clamping circuitry can protect various nodes of the HS level shifter from reaching voltage levels detrimental to the low voltage devices of the HS level shifter.
Figure 6B:
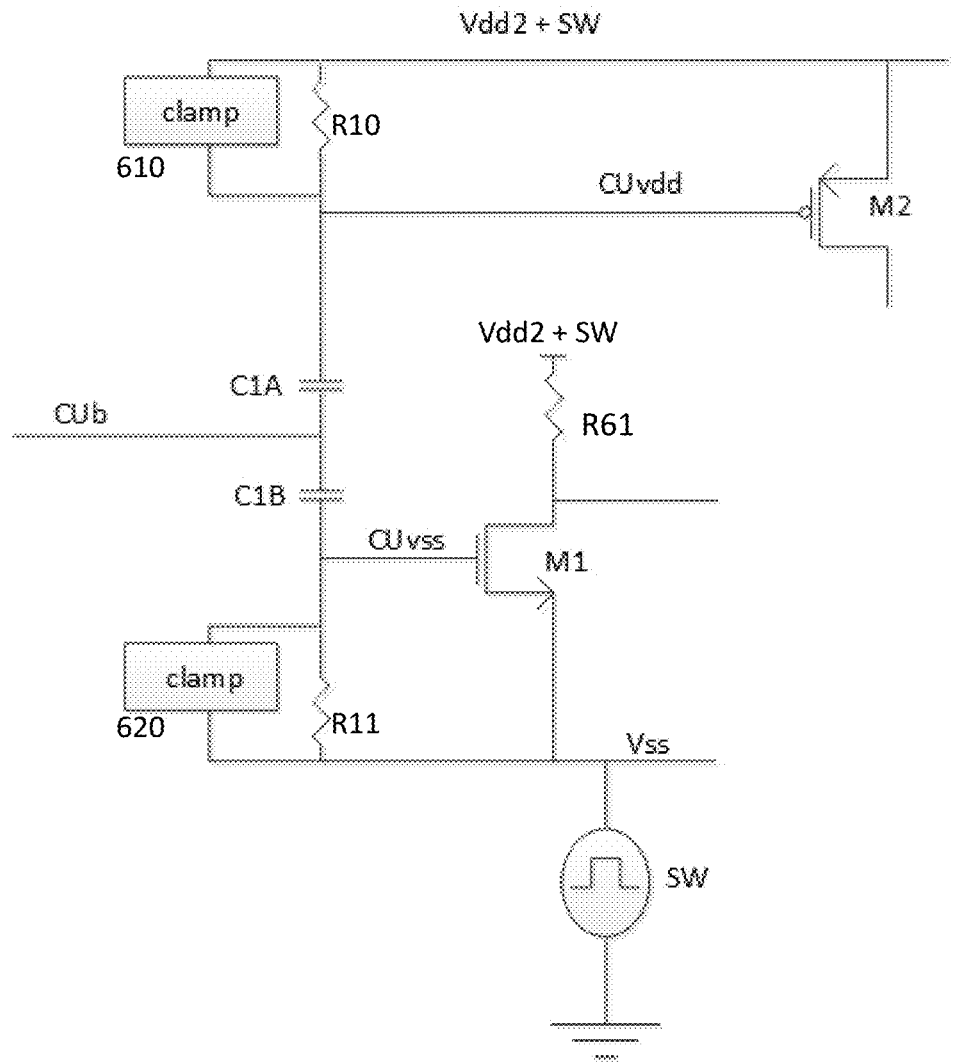
FIG. 6B shows the addition of inverter circuitry to a section of the HS level shifter of FIG. 6A.

With continued reference to the HS level shifter (325) according to the various embodiments of the present disclosure, FIGS. 6A and 6B are now described. As known to a person skilled in the art, and as mentioned in the prior sections of the present disclosure, capacitively coupled signals can force voltages on an output side of a capacitor to spike with a distinctive decay time known as an RC time constant, where R and C are the resistive and capacitive values of a corresponding simple RC circuit (e.g. R10-C1A as shown in FIGS. 4A, 5A and 6A). Such a voltage spike and a corresponding decay time which can alter, for example, a pulse shape at any of the nodes CUvss, CUvdd, CDvss and CDvdd, can cause several issues in the operation of the HS level shifter (325) according to the various embodiments presented in the prior sections, as described below.

As previously mentioned, negative or positive pulses can be forced onto $V_{SS}$ or $V_{DD}$, respectively. To control this effect, and according to a further embodiment of the present disclosure, a clamping circuit (clamp) can be added to the HS level shifter (325), as shown in FIG. 6A (one clamp per node), which actively limits the signals at nodes CUvss, CUvdd, CDvss and CDvdd to be between $V_{SS}$ and $V_{DD}$ for all values of $V_{SS}$ (as a voltage value of $V_{SS}$, tied to common node SW, can move from GND level to $V_{IN}$ level). The specific embodiment of the clamping circuit is described below.

The pulse signals at nodes CUvss, CUvdd, CDvss and CDvdd can be applied to logic gates to latch their values and to make them square wave in nature so as to allow control, for example, of the low side and high side high voltage stacked transistors T1, T2 of FIGS. 3A-3B. As mentioned above, rising or falling $V_{SS}$ or $V_{DD}$ value (as function of the voltage level at common node SW) can cause false pulses at nodes CUvss, CUvdd, CDvss and CDvdd, as the rising or falling level of $V_{SS}$ or $V_{DD}$ is directly coupled to these nodes through resistors R11, R10, R13 and R12 respectively, and delayed due to an associated RC time constant provided by the corresponding node capacitor C1B, C1A, C2B and C2A respectively. Such delay due to a node's RC time constant can create transition pulses at gates of a transistor which in turn can generate false transitions at the output signal HS_out.

Figure 6C:
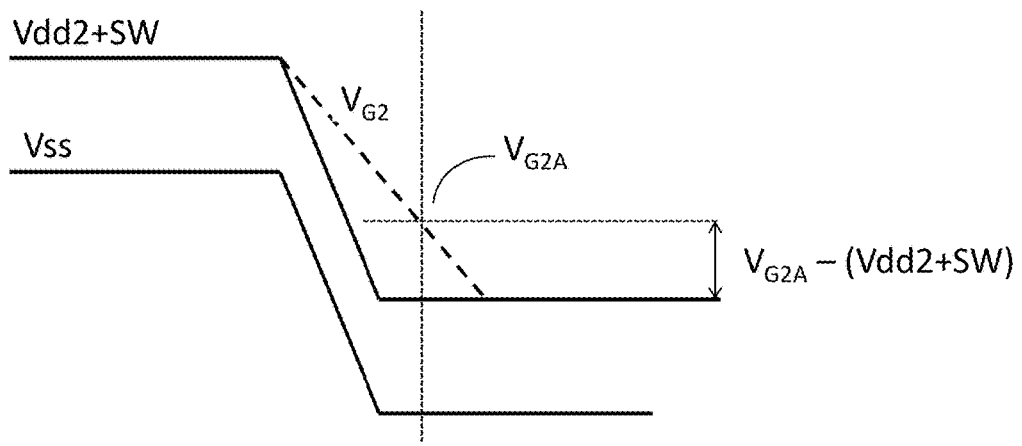
FIGS. 6C-6F show the instantaneous voltage at a gate of a low voltage transistor of the HS level shifter as a function of an RC time constant of a supply and reference potential of the HS level shifter.
Figure 6D:
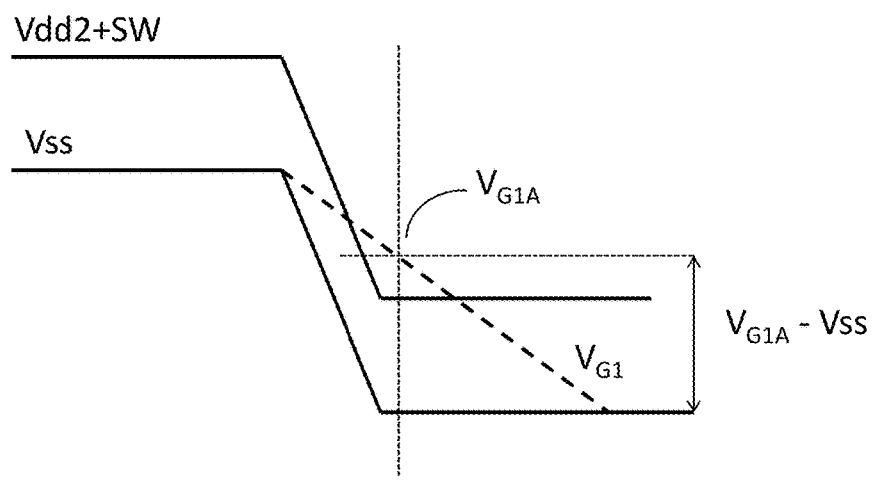
Figure 6E:
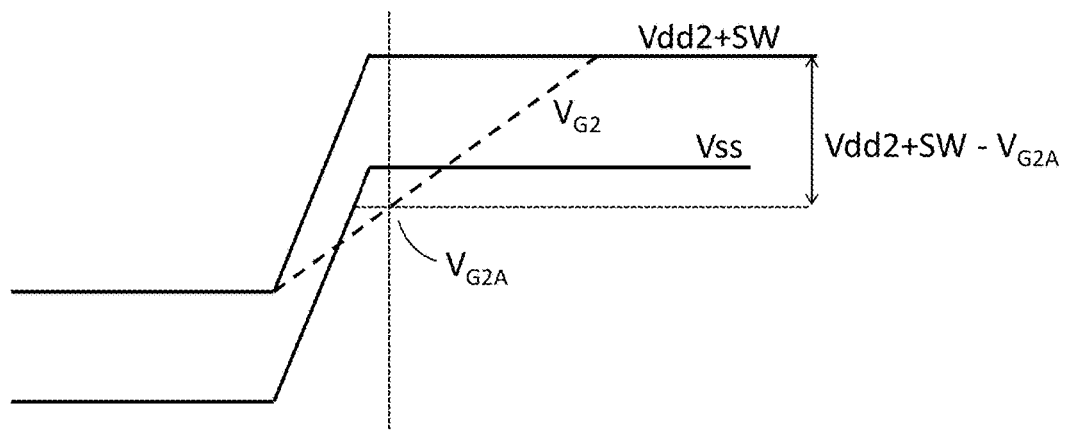

For example, considering the signal at node CUvdd, connected to the gate G2 of transistor M2, at a steady state level of $V_{DD}$. As $V_{SS}$ and $V_{DD}$ rise, as depicted in FIG. 6E, the voltage at node CUvdd follows an RC time constant as indicated by the dotted line $V_{G2}$ in FIG. 6E. Such voltage starts and ends with a corresponding steady state value which corresponds to a high level, but in between the steady states, the voltage transitions and can fall at voltage levels below or equal to the $V_{SS}$ level, as indicated by point $V_{G2A}$ in FIG. 6E. Such transition of the voltage level of the signal at node CUvdd from the steady state high, to a transitional state low, and back to a steady state high, can therefore create false negative pulses at the gate of transistor M2, which in turn can corrupt the timing control signal at output node HS_out. The person skilled in the art will understand that similar false pulses (positive pulses) can be observed during a falling level of the $V_{SS}$ and $V_{DD}$ voltages at nodes which have a low level steady state value, such as node CUvss, and as indicated in FIG. 6D.

Figure 7A:
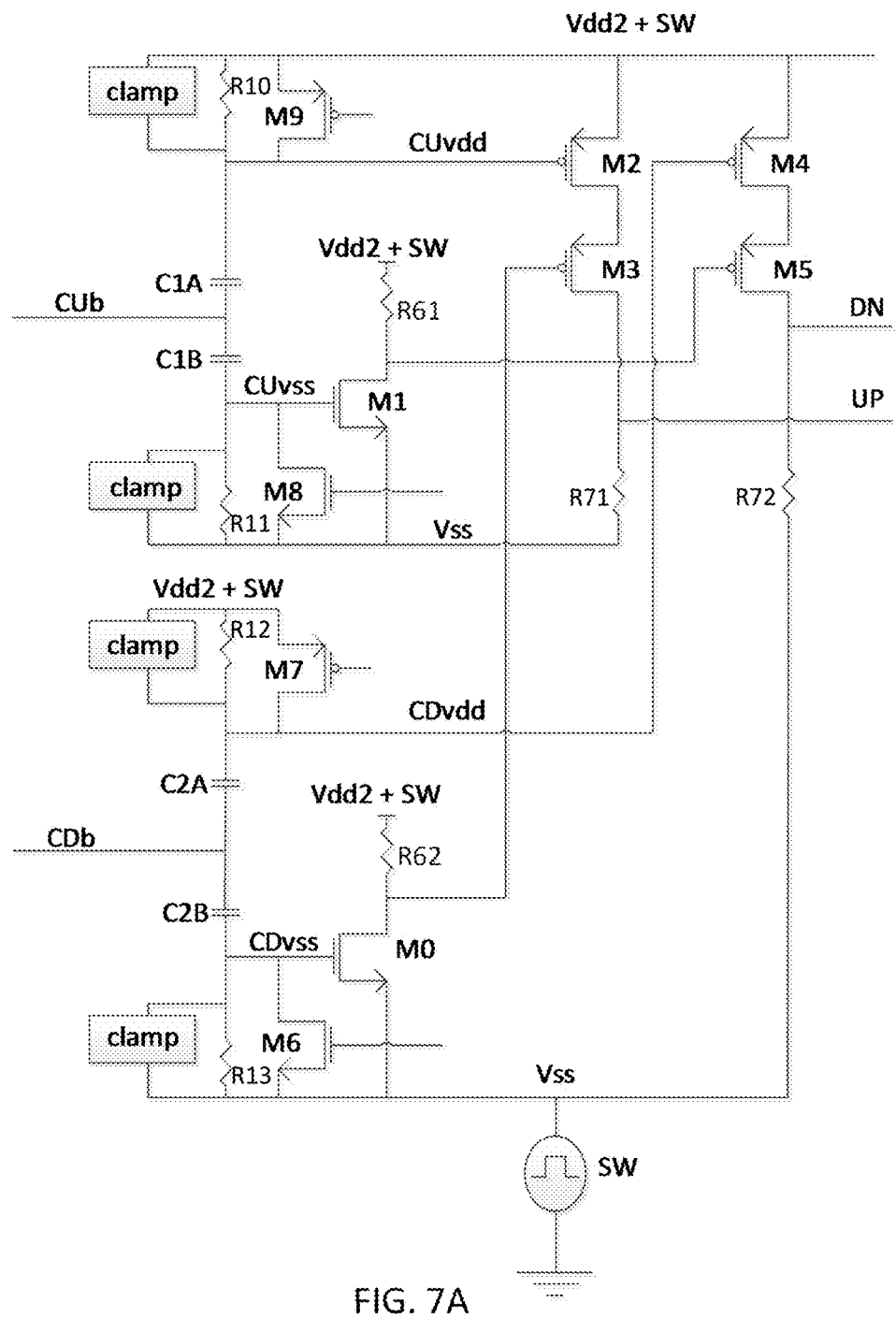
FIG. 7A shows additional circuitry to the HS level shifter of FIG. 6A, where such additional circuitry is used to create two complementary control signals.

The logic to ensure that no false triggers occur (e.g. due to false pulses) is discussed with reference to FIG. 7A which is later described, but it starts by inverting the signals at nodes CUvss and CDvss with inverters, as shown for the case of CUvss in FIG. 6B, where the inverters are composed of transistors M1 and M0, respectively, and their load resistors R61 and R62, respectively, prior to feeding the resultant signal to gates of subsequent logic. Such inversion of signals at nodes CUvss and CDvss is performed in order to get signals of a desired polarity for subsequent processing and provide complementary signals that enable a solution to false triggering due to false pulses. The other nodes, CUvdd and CDvdd, are applied directly to gates of subsequent logic, as depicted in FIG. 7A, and can have the same issue as described here with respect to the signals at nodes CUvss and CDvss. However, by applying complementary signal pairs CUvss/CDvdd and CDvss/CUvdd to logic gates M4/M5 and M2/M3, respectively, false triggers on either rising or falling $V_{SS}$ are prevented.

Figure 6F:
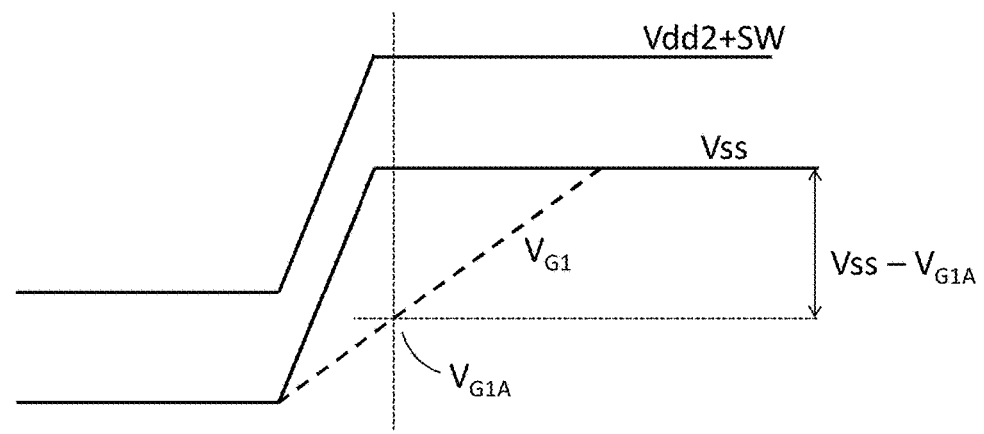

With continued reference to FIG. 6B, and as mentioned above, the node CUvss (denoted G1 in FIG. 6G later described) at the gate of transistor M1 can have a different time constant (e.g. due to a different equivalent RC circuit) than a time constant associated with a switching level of $V_{SS}$ and $V_{DD}$ (i.e. Vdd2+SW). The same difference in time constants can also apply to node CUvdd (denoted G2 in FIG. 6G later described) at the gate of transistor M2 with respect to the switching level of $V_{SS}$ or $V_{DD}$. Therefore, due to such different time constants, an excessive voltage between the gate terminal of, for example, transistor M1, and $V_{SS}$ (e.g. reference potential) can occur, that exceeds the reliable operating voltage of the gate oxide layer of transistor M1 (e.g. $V_{DD}$-$V_{SS}$). As shown in FIGS. 6C and 6D for falling levels of $V_{SS}$ and $V_{DD}$, such high voltage can occur when the gate node (e.g. $V_{G1}$ of M1, $V_{G2}$ of M2 depicted in FIGS. 6C and 6D respectively) is at an instantaneous voltage ($V_{G1A}$, $V_{G2A}$) which is above $V_{DD}$. Similarly, as shown in FIGS. 6E and 6F for rising levels of $V_{SS}$ and $V_{DD}$, such high voltage can occur when the gate node (e.g. $V_{G1}$ of M1, $V_{G2}$ of M2 depicted in FIGS. 6E and 6F respectively) is at an instantaneous voltage ($V_{G1A}$, $V_{G2A}$) which is below $V_{SS}$. Therefore, the clamping circuit according to the embodiment of the present disclosure can provide protection to the level shifter circuitry by preventing the instantaneous voltages at nodes CUvss, CUvdd, CDvss and CDvdd from being outside the range defined by $V_{SS}$ and $V_{DD}$ (where $V_{SS}$=SW and $V_{DD}$=Vdd2+SW).

Figure 6G:
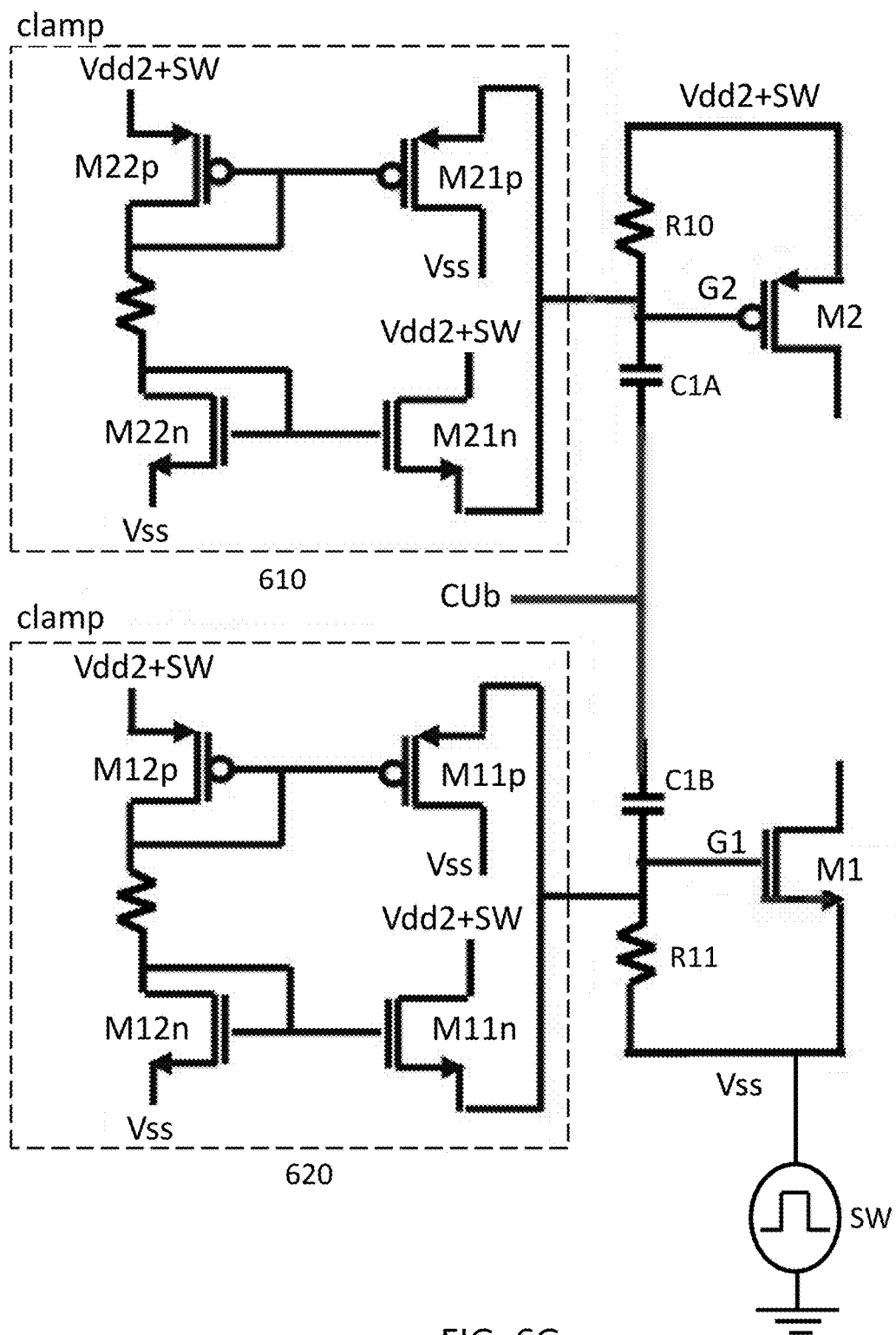
FIG. 6G shows further details of the clamping circuitry and interface to the rest of the HS level shifter.

An exemplary embodiment of a clamping circuit for use in the HS level shifter (325) of FIGS. 6A-6B is shown in FIG. 6G, where two identical clamping circuits 610 and 620 are used to protect the gates of transistors M2 and M1 respectively. It is pointed out that a person skilled in the art readily knows that other clamping circuits are possible and that the exemplary embodiment of the clamping circuit (610, 620) presented herein should not be construed as limiting the scope of the HS level shifter according to the various embodiments of the present disclosure. As shown in FIG. 6G, the exemplary clamping circuit (610, 620) can consist of four MOSFETS, 2 n-type (e.g. (M11n, M12n) and (M21n, M22n)) and 2 p-type (e.g. (M11p, M12p) and (M21p, M22p)). It is assumed for the purposes of describing the circuit that the two n-type and two p-type transistors are matched to each other in current handling capability (e.g. strength, drive), but opposite in polarity.

With continued reference to the exemplary clamping circuit (610, 620) shown in FIG. 6G, one of each type of the four MOSFETs of each clamping circuit has its gate tied to its drain (e.g. (M12n, M12p) of (620), and (M22n, M22p) of (610)), thereby putting them into the well-known diode-connected mode, which means that each of the diode-connected transistors (M12n, M12p) of (620), and (M22n, M22p) of (610) have I-V characteristics equivalent to those of a diode with a forward voltage, Vf, equal to the threshold voltage of the constituent MOSFET. Since each of the diode-connected transistors (M12n, M12p, M22n, M22p) is also connected to the gate of a corresponding same type transistor (M11n, M11p, M21n, M21p), such as, for example, diode-connected M22p transistor connected to the gate of the same type transistor M21p, and diode-connected M22n transistor connected to the gate of the same type transistor M21n, the gate of the corresponding same type transistor (M11n, M11p, M21n, M21p) is held at the diode forward voltage, Vf. This essentially clamps the gate voltage on the n-type transistors (M11n, M21n) and the p-type transistors (M11p, M21p) at their threshold voltage above $V_{SS}$ or below $V_{DD}$, respectively.

Reference will now be made to the two p-type transistors (M21p, M22p) of the top clamping circuit (610) shown in FIG. 6G. With the gate voltage of transistor M21p held at a threshold voltage below $V_{DD}$, transistor M21p starts to conduct when its source voltage rises above $V_{DD}$ (e.g. Vdd2+SW). This effectively clamps the source of transistor M21p at or below $V_{DD}$, and therefore clamps the gate voltage at node G2 of the transistor M2 to be at or below $V_{DD}$.

The two n-type transistors (M21n, M22n) of the top clamping circuit (610) shown in FIG. 6G behave in the same way as the two p-type transistors (M21p, M22p), except with positive threshold voltage (Vth) with respect to $V_{SS}$. More specifically, when the voltage at the gate node G2 of transistor M2 drops below $V_{SS}$, the n-type transistor M21n conducts since its source drops below $V_{SS}$ and therefore its gate to source voltage, Vgs, exceeds its threshold voltage and therefore transistor M21*n* conducts, thereby clamping the gate of transistor M2 to operate at or above the voltage level of $V_{SS}$.

Put together, the exemplary clamping circuit (610) shown in FIG. 6G ensures that the gate of transistor M2 does not operate outside the range defined by $V_{SS}$ and $V_{DD}$, as needed to ensure that the gates of any follow-on logic gates cannot see excess voltage as caused, for example, by the time constant difference of various nodes, as described in detail above and depicted in FIGS. 6C-6F. This is true before, during and after any rise or fall in levels of $V_{SS}$ and $V_{DD}$, in an absolute sense (as both these voltages depend on the switching voltage at node SW). In other words, as $V_{SS}$ and $V_{DD}$ charge up and down, the gates of the clamped circuits are held at all time in the range $V_{SS}$ to $V_{DD}$, thereby ensuring reliable operation of the HS level shifter circuit according to the various embodiments of the present disclosure.

A same clamping circuit (620) composed of transistors (M11*n*, M12*n*, M11*p*, M12*p*) can be applied to the gate of transistor M1 as depicted in the lower block of FIG. 6G. A same clamping circuit can also be used in all the blocks labeled "clamp" in FIGS. 6A, 6B, 7A and 8 to protect the various transistor devices used in these blocks.

Figure 7B:
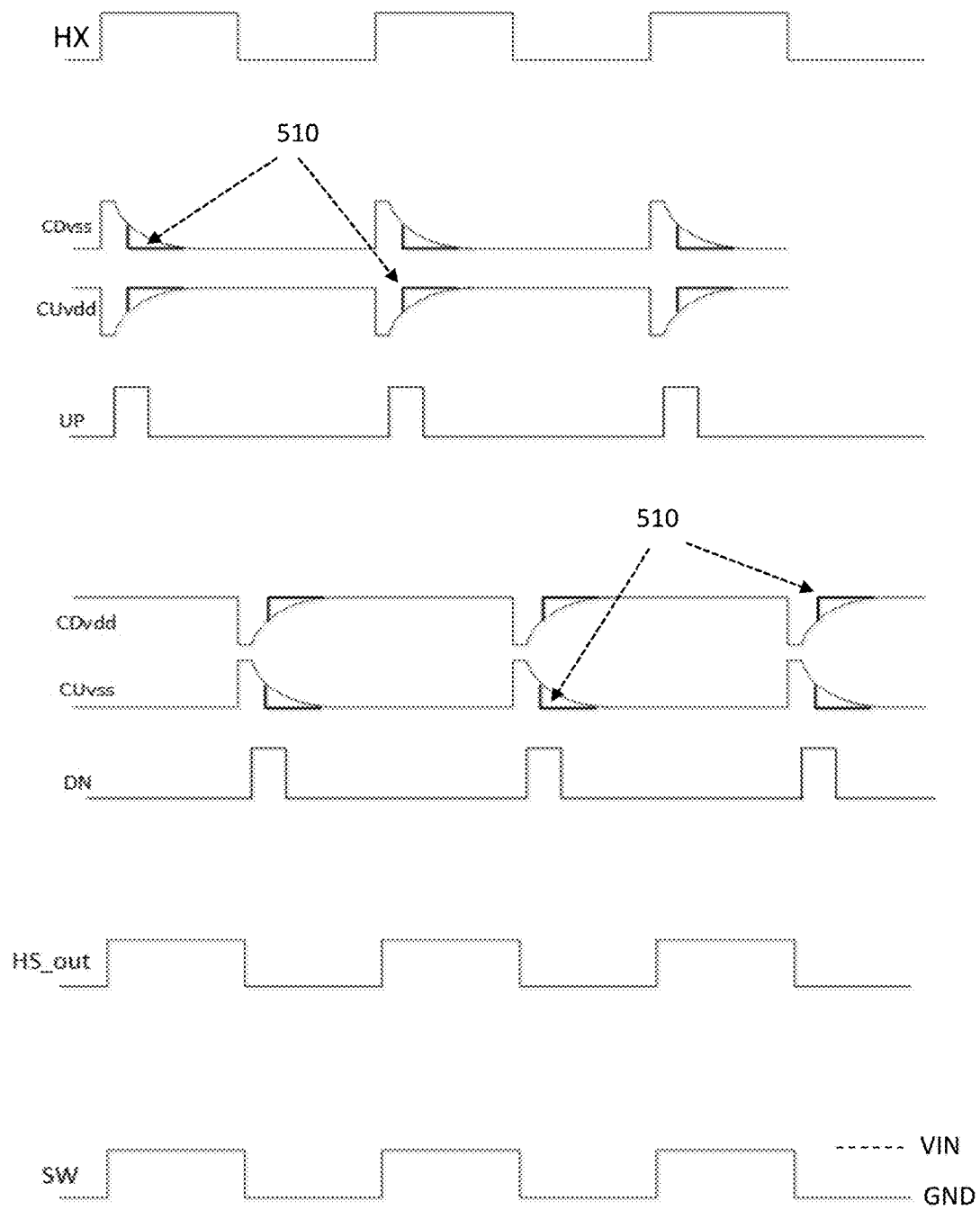
FIG. 7B shows timing diagrams of the two complementary control signals of FIG. 7A.

The HS Level Shifting circuit (325) enables low voltage signals and transistors to control high voltage devices and nodes (e.g. T1, T2, $V_{IN}$). FIGS. 7A-7B and FIG. 8 show auxiliary circuitry that completes the high side control function (e.g. block (355)) in a manner that enables control of the high voltage stacked transistor devices (e.g. DC/DC converter) shown in FIGS. 3A-3B.

FIG. 7A shows logic circuitry, which can be used in the Logic block (330) of the gate driver (310) depicted in FIGS. 3A-3B, that converts the pulsed signals at nodes CUvss, CUvdd, CDvss and CDvdd into square wave logic needed to turn ON and OFF the LS transistor T1 and the HS transistor T2 of the high voltage stacked GaN FETs of FIGS. 3A-3B. Transistor stack (M2, M3) represent a 2-input NAND gate with active low inputs (output is HI if both inputs are LOW), as does transistor stack (M4, M5), which in combination with the inverters M0 and M1 provide the logic to generate a pulse signal at the UP and DN nodes when pulses are present at CUvdd and CDvss or at CUVss and CDvdd.

Transistors M2 and M3 of FIG. 7A pull node labeled UP to HI (e.g. $V_{DD}$) level when CUvdd and inverse of CDvss are both LOW (e.g. at $V_{SS}$ level). Since CDvss is HI when inverse of CDvss is LOW, UP node only goes HI when there is a negative pulse on CUvdd and a positive pulse on CDvss. A rising $V_{SS}$ (e.g. SW) and $V_{DD}$ (e.g. Vdd2+SW) can induce false positive pulses at node CDvss and can have no effect on node CUvdd, and likewise, a falling $V_{SS}$ (e.g. SW) and $V_{DD}$ (e.g. Vdd2+SW) can induce false negative pulses at node CUvdd and can have no effect on node CDvss. Since signal at node UP goes HI only when there is a negative pulse on CUvdd and a positive pulse on CDvss, and since neither a rising nor a falling $V_{SS}$ (e.g. SW) and $V_{DD}$ (e.g. Vdd2+SW) can simultaneously create opposite going pulses at nodes CDvss and CUvdd, false triggers (pulses) at node UP due to rising/falling $V_{SS}$ and $V_{DD}$ are avoided.

With continued reference to FIG. 7A, transistor stack (M4, M5) represents a 2-input NAND gate with active low inputs. M4 and M5 pull node labelled DN to a HI (e.g. $V_{DD}$) level when CDvdd and inverse of CUvss are both LOW. Since M5 gate voltage is low when CUvss is HI, DN node only goes HI when there is a negative pulse on CDvdd and a positive pulse on CUvss. A rising $V_{SS}$ (e.g. SW) and $V_{DD}$ (e.g. Vdd2+SW) can induce false positive pulses at node CUvss and can have no effect on node CDvdd, and likewise, a falling $V_{SS}$ (e.g. SW) and $V_{DD}$ (e.g. Vdd2+SW) can induce false negative pulses at node CDvdd and can have no effect on node CUvss. Since signal at node DN goes HI only when there is a negative pulse on CDvdd and a positive pulse on CUvss, and since neither a rising nor a falling $V_{SS}$ and $V_{DD}$ can simultaneously create opposite going pulses at nodes CDvdd and CUvss, false triggers (pulses) at node DN due to rising/falling $V_{SS}$ and $V_{DD}$ are avoided. This completes the explanation of how the level shifter according to the various embodiments of the present disclosure ensures against false triggers due to rising/falling of $V_{SS}$ and $V_{DD}$. As discussed in the above sections of the present disclosure, a key element to the immunity of the level shifter according to the various embodiments of the present disclosure with respect to possible false triggering due to the shifting nature of the supply and reference voltages ($V_{DD}$ and $V_{SS}$) to the level shifter, is the condition that only two pulses of opposite polarities can trigger an output pulse event at either the UP or the DN nodes.

FIG. 7B shows the timing diagram for the circuitry shown in FIG. 7A. As shown in FIG. 7B, both signals at the UP and DN nodes are square wave signals containing timing information obtained from the input HX signal to initiate turning ON or OFF the high side GaN FET, T2, of FIGS. 3A-3B, respectively.

As can be seen in the timing diagram of FIG. 7B, one edge (rising) of the input signal HX causes CUvdd, which is normally HI, to go LOW, and causes CDvss, which is normally LOW, to go HI, therefore in combination, causing the signal at the UP node to transition from its normally LOW state to a HI state. Similarly, the opposite edge (falling) of the input signal HX causes CDvdd, which is normally HI, to go LOW, and causes CUvss, which is normally LOW, to go HI, therefore in combination, causing the signal at the DN node to transition from its normal LOW state to a HI state. As a result, LOW to HI transitions of signals at the UP and DN nodes represent timing information of the input HX signal respectively associated with rising and falling edges of the input HX signal.

FIG. 8 adds in a final logic block (LOGIC_out), which can be used in the Logic block (330) of the HS level shifter (325) of the gate driver (310) depicted in FIGS. 3A-3B, that converts the timing information at the UP and DN nodes into one ON and OFF signal at the HS_out terminal of the final logic block LOGIC_out. In particular, such LOGIC_out block can convert the timing information in the UP and DN pulses into a signal (HS_out) which has the same duty cycle as the input signal HX, as can be seen in FIG. 7B. This can be achieved, for example, by a simple SR flip-flop logic, as known to the skilled person, which flips state of its output with each input pulse. As can be seen in the timing diagram depicted in FIG. 7B, the rising edge of the HS_out signal output by the LOGIC_out block corresponds to the concurrent detection of pulses (e.g. where active region of the pulses overlap, active region of a positive pulse signal being the region where the signal is in a high state, and active region of a negative pulse signal being the region where the signal is in a low state) of opposite polarities at the CDvss and CUvdd nodes which generate the UP pulse. Similarly, the falling edge of the HS_out signal output by the LOGIC_out block corresponds to the concurrent detection of pulses of opposite polarities at the CDvdd and CUvss nodes which generate the DN signal. The signal at HS_out is a level-shifted in-phase version of the IN signal provided at the input terminal IN of the gate driver circuit (310) of FIGS. 3A-3B (e.g. originated in a PWM not shown, but discussed above) whose timing (e.g. edge to edge distance) and level are intended to control the turning ON and OFF of the high side GaN FET T2. As mentioned in the above sections of the present disclosure, the HS_out signal output by the LOGIC_out block is fed to the HS output driver (355) for conversion to an HS_out (equivalent) signal which contains the exact same timing information but with the drive and amplitude required to drive the high side GaN FET T2 (thereby denoting both signals HS_out). Combination of the HS_out signal with the LS_out signal for the low side GaN FET T1 creates the desired ON percentage (e.g. $V_{IN}$ versus GND) at the common node SW. As previously mentioned in the present disclosure, the signal at node SW is the DC/DC converter output node (prior to filtering), pulled up to $V_{IN}$ or pulled down to GND per instructions from the IN signal (e.g. PWM). A person skilled in the art can appreciate that all the signals shown in FIG. 7B have low voltage logic swings (such as being bounded by $V_{SS}$ and $V_{DD}$) except for signal at node SW, which has a HI level of $V_{IN}$ and a LOW level of GND.

Figure 9:
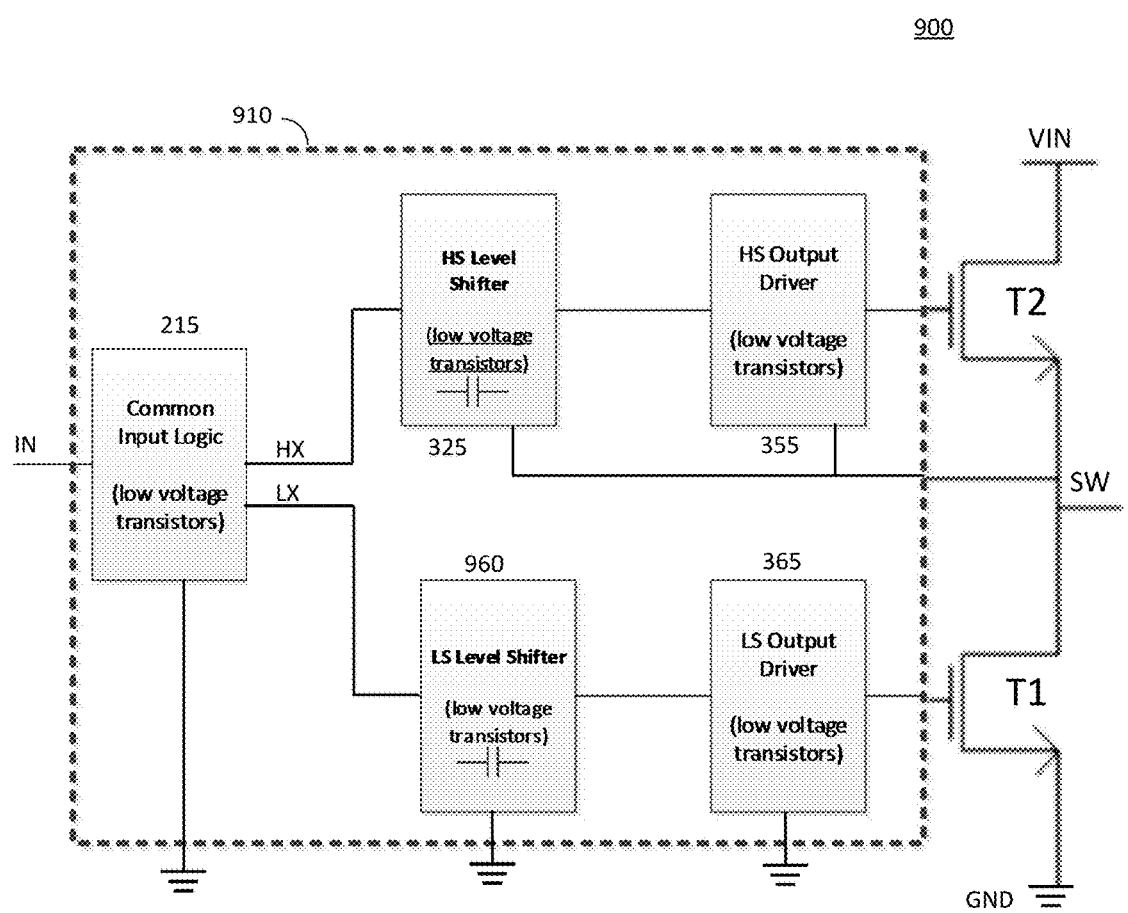
FIG. 9 shows a block diagram of a gate driver circuit according to an embodiment of the present disclosure where two low voltage level shifters similar to the HS level shifter of FIGS. 3A-3B are used, each controlling one transistor of the stack depicted in FIG. 1.

FIG. 9 depicts a further embodiment of a gate driver (910) of the present disclosure which uses a level shifter similar to the HS level shifter (325) according to the various previous embodiments presented above for a low side control path of the low side high voltage transistor T1 (960) and a high side control path of the high side high voltage transistor T2 (325). This exemplary approach according to an embodiment of the present disclosure can ensure that signal paths for a control signal at the input IN terminal of the gate driver (910) to each of the GaN FETs T1 and T2 have equal propagation delays and signal levels (e.g. attenuation). In other words, the high side control path comprising the HS level shifter (325) and the HS output driver (355) has a same propagation delay as the low side control path comprising the LS level shifter (960) and the LS output driver (365), where all circuits (325, 355, 365, 960) use exclusively low (breakdown) voltage transistors. In particular, the low side level shifter (960) can have a same input coupling stage of the input timing signal LX as the input coupling stage of the high side level shifter (325). As mentioned in the above sections of the present disclosure, such input coupling stage can be a non-galvanic coupling, such as, for example, a capacitive coupling. The person skilled in the art can appreciate that equalizing delay of the HS and LS paths (e.g. controlling an associated signal delay and attenuation) can help control a dead time or an overlap time between the GaN FETs (T1 and T2) for an increased performance of the implementation. It is an exemplary embodiment of the current invention to have two level shifter circuits (e.g. 325, 960). Such exemplary implementation should not be construed as limiting the scope of the present teachings, as the person skilled in the art readily realizes other exemplary implementations using one or more such level shifter (325) can be possible.

The person skilled in the art readily understands that the various teachings of the present disclosure can apply to multiple semiconductor materials and device structures. For simplicity, the embodiments and examples presented herein for illustrative purposes include only GaN FETs as the high voltage devices controlled by the gate driver circuit (e.g. HS level shifter) according to the various embodiments of the present disclosure, and SOI MOSFETs for the low voltage control devices used in the gate driver circuit (e.g. HS level shifter). The person skilled in the art can use the teachings according to the various embodiments of the present disclosure to derive level shifters and controls using other types of low voltage transistors (e.g. non SOI MOSFETs) and for interfacing with other types of high voltage transistors (e.g. non GaN FETs).

As mentioned in the prior sections of the present disclosure, the Level Shifter (e.g. HS level shifter (325)) according to the various presented embodiments, as well as the gate driver circuit (310, 910), can be manufactured, either in its entirety or partially, in an integrated circuit based on various technologies, and in particular in CMOS or SOI CMOS. Again, as mentioned above, CMOS technologies, whether bulk Si or SOI, have high level of integration, ease of manufacturing and an associated low cost. Furthermore and as previously noted, low voltage (e.g. standard CMOS) transistors can have speed and performance which can drive GaN circuits (e.g. comprising high voltage GaN FET transistors) in a manner that benefits from the low FOM of GaN transistors.

However, while no transistor in the current level shifter (e.g. HS level shifter (325)) withstands a high voltage across the transistor (e.g. across its drain and source), the overall circuit as described above (e.g. level shifter) floats to high voltage (e.g. with voltage at node SW) and therefore the entire circuit is isolated from GND and withstands the high voltage drop from $V_{IN}$ to GND.

Figure 10A:
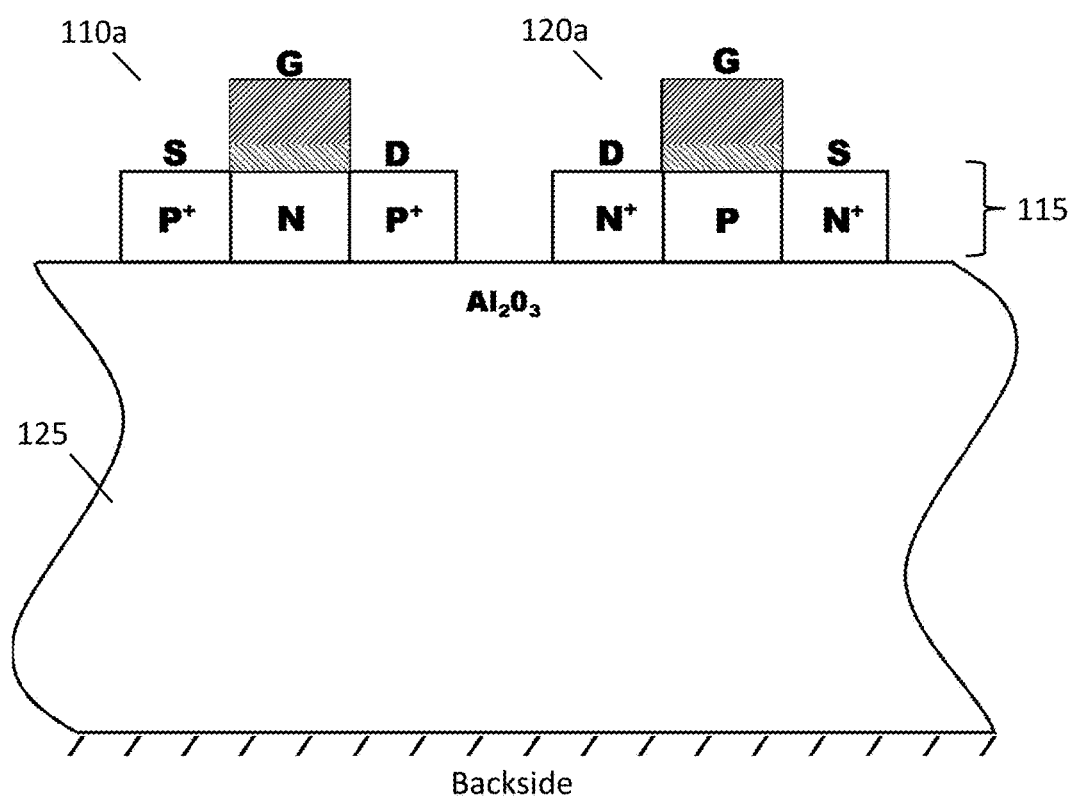
FIGS. 10A-10C show different low voltage transistor structures which can be used in the various embodiments of the HS level shifter according to the present disclosure.
Figure 10B:
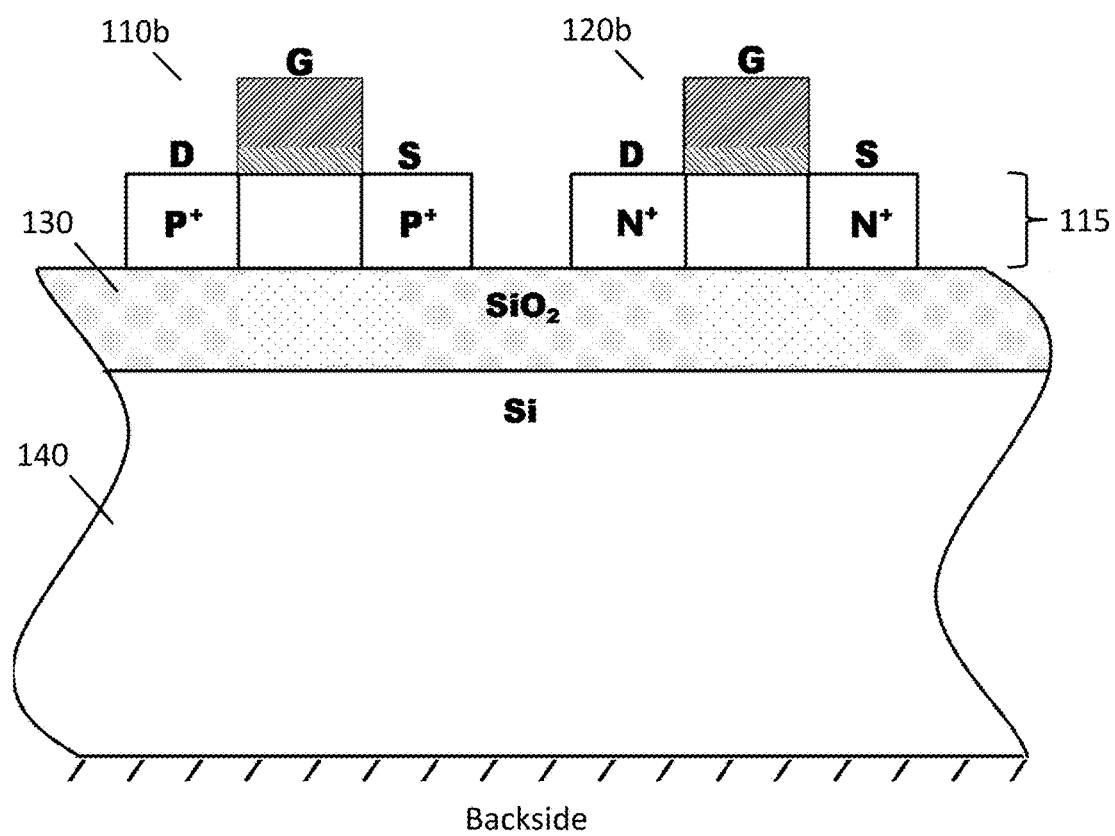
Figure 10C:
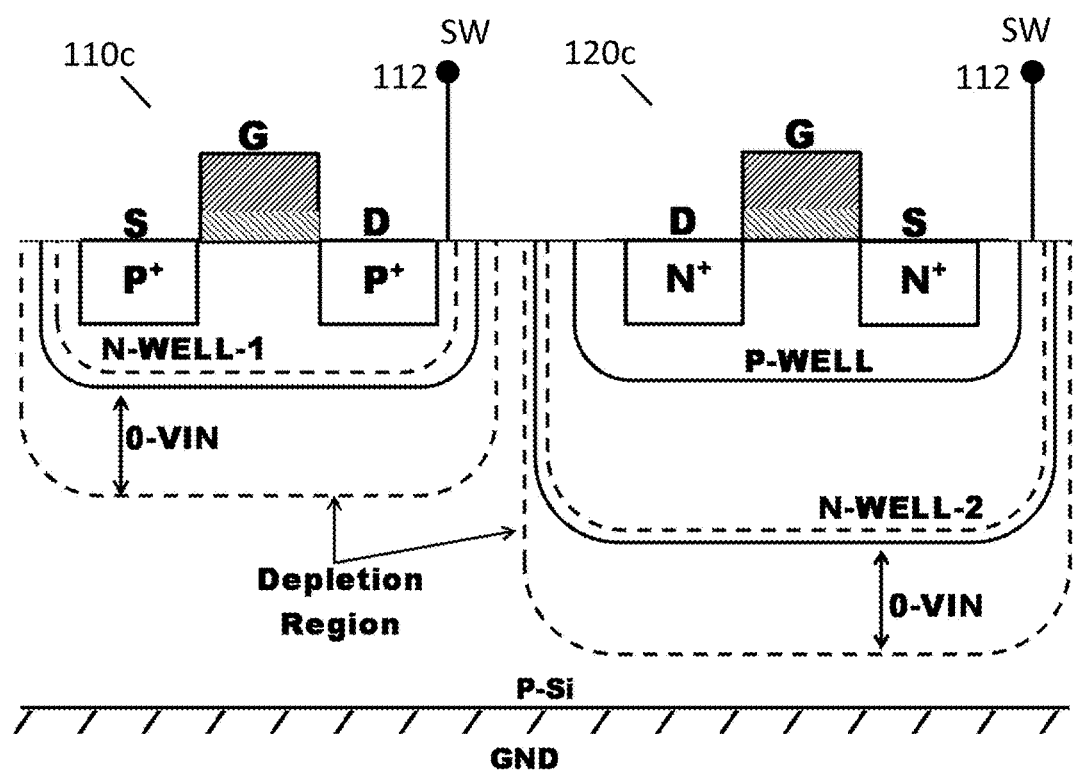

FIGS. 10A, 10B and 10C depict cross sections of the three main CMOS semiconductor technologies, listed above, specifically, SOS, SOI and bulk Si, respectively. A person skilled in the art readily recognizes that each of such cross sections shows a single P and a single N type transistor, and that only the very basic features of the transistors are shown, e.g. their source, S; their drain, D; and their gate, G.

The cross section depictions in FIGS. 10A, 10B and 10C of the two transistor types can be understood by a person skilled in the art to represent any array of transistor circuitry. In each version of CMOS shown, the transistors, both P and N types, are low voltage transistors as used in the level shifter (e.g. HS level shifter (325, 925)) of the present disclosure, e.g., they are capable of handling a low source-drain voltages of only, for example, 5 Volts, or less.

FIG. 10A shows an exemplary silicon on sapphire (SOS) structure comprising two low voltage transistor devices (110a, P type) and (120a, N type) each comprising a gate terminal (G), a drain terminal (D) and a source terminal (S), whose P+ and N+ drain and source regions are formed within a thin Si layer (115) fabricated atop a sapphire ($Al_2O_3$) substrate (125). While the low voltage transistors (110a) and (110b) in FIG. 10A can only withstand low voltage, say up to 5V (between any two S, D, G terminals), an entire transistor circuit of the SOS structure depicted in FIG. 10A can float from 0-$V_{IN}$ volts with respect to GND. According to an embodiment of the present disclosure, the backside of the SOS structure depicted in FIG. 10A, denoted Backside, can be connected to a DC voltage, such as 0V (GND), or left unconnected (floating). In the case of the level shifter (e.g. HS level shifter (325, 925)) according to the present teachings, the reference voltage for the level shifter circuitry (e.g. high side) is at $V_{SS}$ level (e.g. tied at common node SW), which is either 0 V (e.g. when the LS GaN FET T1 is ON), up to a voltage level of $V_{IN}$ (e.g. when the HS GaN FET T2 is ON). Therefore, as a person skilled in the art can recognize, the low voltage transistors (110a) and (110b) represented in FIG. 10A can operate at a high voltage (e.g. equal to or larger than Vin) with respect to GND without ever having to handle any high voltage being impressed across them (e.g. across a corresponding source and drain). Instead, the sapphire substrate has the high voltage drop across its entire thickness. In a typical embodiment, the sapphire substrate (125) may be 10's to 100's of micrometers thick and therefore the electric field created by such high voltage is well below the well-known dielectric strength of the sapphire.

FIG. 10B shows an exemplary silicon on insulator (SOI) transistor structure comprising two low voltage transistor devices (110b, P type) and (120b, N type), each comprising a gate terminal (G), a drain terminal (D) and a source terminal (S), in which a thin Si layer (115), which comprises the P+ and N+ source and drain regions of the P type and N type transistors, is formed on a buried silicon dioxide layer (130), thence on a Si substrate (140). As in the case of the SOS structure of FIG. 10A, while the low voltage transistors (110b) and (120b) of the structure depicted in FIG. 10B can only withstand up to, say, 5V (between any two S, D, G terminals), the entire transistor structure can float from 0-$V_{IN}$ volts with respect to GND. According to an embodiment of the present disclosure, the backside of the SOI structure depicted in FIG. 10B, denoted Backside, can be connected to a DC voltage, such as 0V (GND), or left unconnected (floating). In the case of the level shifter (e.g. HS level shifter (325, 925)) according to the present teachings, the reference voltage for the level shifter circuitry (e.g. high side) is at $V_{SS}$ voltage level, which is either 0 V (e.g. when the LS GaN FET T1 is ON) up to a voltage level of $V_{IN}$ (e.g. when the HS GaN FET T2 is ON). Therefore, as a person skilled in the art can recognize, the low voltage transistors (110b) and (120b) represented in FIG. 10B can operate at a high voltage (e.g. equal to or larger than Vin) with respect to GND without ever having that high voltage impressed across them (i.e. across any two constituent terminals S, D, G). Instead, the buried silicon dioxide layer has the high voltage drop across its thickness. Such buried silicon dioxide layer is clearly much thinner than the sapphire substrate in the SOS embodiment shown in FIG. 10A.

In a typical SOI embodiment, the Si layer (115) and the buried silicon dioxide layer (130) can typically be 0.1-1.0 micrometers in thickness and the Si substrate (140) underneath the Si layer (115) and the buried silicon dioxide layer (130) can typically be 10's to 100's of micrometers thick. Therefore, the electric field inside the buried silicon dioxide layer (130) can typically be higher than in the sapphire substrate case depicted in FIG. 10A (since typically the sapphire substrate is much thicker than the silicon dioxide layer and can therefore withstand a much higher $V_{IN}$ voltage). In a properly designed embodiment, the buried silicon dioxide layer (130) is thick enough to withstand a maximum electric field associated to a voltage $V_{IN}$ plus any noise spikes that may be impressed on the $V_{IN}$ voltage, applied to the GND plane of the Si substrate (140).

FIG. 10C shows an exemplary bulk Si transistor structure comprising two low voltage transistor devices (110c, P type) and (120c, N type), each comprising a gate terminal (G), a drain terminal (D) and a source terminal (S). A person skilled in the art readily knows that such structure is at least semiconductive throughout its entire thickness. Since Si is a good conductor relative to insulators such as silicon dioxide or sapphire, the high voltage $V_{IN}$ must be dropped across corresponding reverse-biased diodes of such bulk Si structure that have high enough stand-off voltage to provide isolation to the grounded Si substrate. In the exemplary structure depicted in FIG. 10C, the high voltage, $V_{IN}$, is dropped across the diode formed by the bottom N-wells (N-WELL-1 and N-WELL-2) and the p-type substrate. This is shown in FIG. 10C for the typical case where $V_{IN}$ is positive, where N-WELL1 and N-WELL2 are connected, via an associated terminal (112), to node SW which swings form 0 (GND) to $V_{IN}$. The person skilled in the art readily knows that for the case where $V_{IN}$ is negative, polarities of the structures shown in FIG. 10C can be reversed (e.g. all P structures to N structures and vice versa) in order to allow the bulk p-Si substrate, which is grounded on its back side (e.g. connected to GND), to handle a large negative voltage drop ($V_{IN}$<0V). In such case where $V_{IN}$ is negative, node SW can be connected to P-WELLS provided within the Si substrate (connection not shown in FIG. 10C). The person skilled in the art readily knows that other well structures can be used in a Si structure as long as such wells can provide high voltage handling capability equal to or larger than $V_{IN}$. Again, while the low voltage transistors in the structure depicted in FIG. 10C can only withstand up to, for example, 5V, the N-wells can float from 0-$V_{IN}$ volts with respect to GND.

Unlike insulators such as silicon dioxide or sapphire, diodes in bulk Si structures can block current only in one direction, therefore as described above, the exemplary transistor structure depicted in FIG. 10C used in a level shifter (e.g. HS level shifter (325, 960)) according to the various embodiments of the present disclosure can work for cases where $V_{IN}$>0V (=GND), or, by using an alternate wells structure (e.g. reverse polarity structures), for cases where $V_{IN}$<0V. The insulator-based transistor structures depicted in FIGS. 10A and 10B can handle both positive and negative values of $V_{IN}$, and can therefore be used in a level shifter according to the various embodiments of the present disclosure where $V_{IN}$ takes either or both positive and negative values. Since bulk Si structures can be cheaper, however, it is valuable to note that while the insulator-based solutions may have superior performance or flexibility, the bulk Si solution may have reduced cost.

With this semiconductor description, an innovative apparatus for biasing and driving high voltage semiconductor devices using only low (breakdown) voltage transistors has been disclosed.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

It may be possible to execute the activities described herein in an order other than the order described. Various activities described with respect to the methods identified herein can be executed in repetitive, serial, or parallel fashion.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived there-from, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

The invention claimed is:

1. A level shifter configured to control a high voltage device capable of withstanding a voltage higher than a first voltage (VIN), comprising:
   a circuital arrangement comprising transistor devices, each transistor device configured to withstand a second voltage (Vdd2) substantially lower than the first voltage, the circuital arrangement configured to operate between a first switching voltage (SW) and a second switching voltage (Vdd2+SW);
   a first supply terminal of the circuital arrangement, configured to carry the first switching voltage, the first switching voltage switching between a reference voltage and the first voltage;
   a second supply terminal of the circuital arrangement, configured to carry the second switching voltage as a function of the first switching voltage, the second switching voltage substantially corresponding to a sum of the first switching voltage and the second voltage;
   an input terminal of the circuital arrangement, the input terminal configured to receive a first and a second input timing control signals for controlling the high voltage device, the first and second input timing control signals configured to be coupled to the transistor devices of the circuital arrangement by way of respective first and second capacitive couplings, wherein each of the respective first and second capacitive couplings comprises two series connected capacitors and a common node between the series connected capacitors, the common node configured to receive a respective one of the first and second timing control signals; and
   an output terminal of the circuital arrangement, the output terminal configured to provide an output timing control signal at a voltage higher than the first switching voltage to the high voltage device, the output timing control signal being based on the coupled input timing control signals,
   wherein the second timing control signal is an inverted version of the first timing control signal.

2. The level shifter of claim 1, wherein the first voltage is equal to or higher than 10 volts, and the second voltage is equal to or lower than 5 volts.

3. The level shifter of claim 1, wherein the first voltage is equal to or higher than 25 volts, and the second voltage is equal to or lower than 2.5 volts.

4. The level shifter of claim 1, wherein the second timing control signal is further time shifted with respect to the first timing control signal.

5. The level shifter of claim 1, wherein each of the first and second input timing control signals comprises a pulse signal defined by a first voltage level, a second voltage level, a first transition from the first voltage level to the second voltage level, and a second transition from the second voltage level back to the first voltage level, and wherein each of the first and second capacitive couplings is configured to respectively detect the first and second transitions of the first and the second timing control signals.

6. The level shifter of claim 5, wherein the output timing control signal comprises a low state with a voltage level substantially equal to the first switching voltage and a high state with a voltage level substantially equal to the second switching voltage.

7. The level shifter of claim 6, wherein a transition from the low state to the high state of the output timing control signal is based on concurrent detection of a pulse corresponding to a rising transition of the first timing control signal and a pulse corresponding to a falling transition of the second timing control signal.

8. The level shifter of claim 7, wherein a transition from the high state to the low state of the output timing control signal is based on concurrent detection of a pulse corresponding to a falling transition of the first timing control signal and a pulse corresponding to a rising transition of the second timing control signal.

9. The level shifter of claim 7, wherein for each of the respective first and second capacitive couplings, a first capacitor of the two series connected capacitors is coupled via a resistor connected to a terminal of the first capacitor away from the common node to the first supply terminal, and a second capacitor of the two series connected capacitors is coupled via a resistor connected to a terminal of the second capacitor away from the common node to the second supply terminal.

10. The level shifter of claim 9, wherein a plurality of transistor devices of the transistor devices of the circuital arrangement are configured as discharge transistors to shorten pulse signals in correspondence of the detected first and second transitions at the terminals of the first capacitor and the second capacitor away from the common node.

11. The level shifter of claim 10, wherein the discharge transistors are connected in parallel to the resistor connected to the first capacitor and to the resistor connected to the second capacitor, and are configured to discharge the first and the second capacitors.

12. The level shifter of claim 9, wherein a transistor of the transistor devices of the circuital arrangement is configured to operate as an inverter to invert positive pulse signals in correspondence of detected rising transitions of the first and second transitions at the terminal of the first capacitor away from the common node.

13. The level shifter of claim 9, wherein a plurality of transistors devices of the transistor devices of the circuital arrangement are configured as clamp circuits to limit an instantaneous voltage of pulse signals in correspondence of the detected first and second transitions between the first switching voltage and the second switching voltage.

14. The level shifter of claim 13, wherein the clamp circuits are further configured to limit amplitudes of negative pulse signals in correspondence of detected falling transitions of the first and second transitions at the terminal of the first capacitor away from the common node, and to remove positive pulse signals in correspondence of detected rising transitions of the first and second transitions at the terminal of the second capacitor away from the common node.

15. The level shifter of claim 1, wherein the transistor devices of the circuital arrangement comprise one of: a) a silicon on sapphire (SOS) transistor structure, b) a silicon on insulator (SOI) transistor structure, and c) a bulk silicon (Si) transistor structure.

16. The level shifter of claim 15, wherein a) comprises a sapphire substrate that is selected such as to withstand a voltage drop equal to or larger than the second switching voltage.

17. The level shifter of claim 16, wherein a thickness of the sapphire structure is in a range of 10's to 100's micrometers.

18. The level shifter of claim 15, wherein b) comprises a buried silicon dioxide layer whose silicon dioxide thickness is capable of withstanding a voltage drop equal to or larger than the second switching voltage.

19. The level shifter of claim 18, wherein the silicon dioxide thickness of the buried silicon dioxide layer is 0.1-1.0 micrometers.

20. The level shifter of claim 15, wherein c) comprises:
a silicon (Si) substrate;
an N-well structure embedded in the Si substrate; and
a well terminal connected to the N-well structure, wherein the well terminal is configured, during operation, to carry the first switching voltage.

21. The level shifter of claim 20, wherein the silicon substrate comprises a substrate terminal configured, during operation, to carry the reference voltage.

22. The level shifter of claim 20, wherein the N-well structure is configured, in combination with the Si substrate, to create a reverse-biased N-well diode capable of withstanding a voltage drop equal to or larger than the first switching voltage.

23. A high voltage switching device comprising the level shifter of claim 1.

24. The high voltage switching device of claim 23, further comprising a high voltage transistor device configured, during operation, to be capable of withstanding the first voltage, wherein operation of the high voltage transistor device is controlled by the level shifter.

25. The high voltage switching device of claim 24, wherein operation of the high voltage transistor device comprises control of the high voltage transistor device to operate in one of two modes of operation; an ON mode which provides a conduction path to the first voltage, and an OFF mode which removes the conduction path.

26. The high voltage switching device of claim 25, wherein the conduction path is a conduction path between a drain terminal and a source terminal of the high voltage transistor device.

27. The high voltage switching device of claim 26, wherein control of the device is provided via connection of the gate terminal of the high voltage transistor device to the output terminal of the level shifter.

28. The high voltage switching device of claim 27, wherein the first supply terminal of the level shifter is connected to the source terminal of the high voltage transistor device.

29. The high voltage switching device of claim 28, wherein during the ON mode of operation, a voltage of a signal at the source terminal of the high voltage transistor device is substantially equal to the first voltage, and during the OFF mode of operation, a voltage of the signal at the source terminal of the high voltage transistor device is substantially equal to the reference voltage.

30. The high voltage switching device of claim 29, wherein the timing control signal at the output terminal of the level shifter provided to the gate terminal of the high voltage transistor device is configured to control an average voltage based on a duty cycle of the signal at the source terminal of the high voltage transistor device.

31. The high voltage switching device of claim 30, wherein the first and second input timing control signals at the input terminal of the level shifter are based on the average voltage.

32. A DC/DC converter for conversion of a high DC voltage to a low DC voltage comprising the high voltage switching device of claim 31.

33. A method for controlling a high voltage device capable of withstanding a voltage higher than a first voltage (VIN) with low voltage devices capable of withstanding a second voltage (Vdd2), the first voltage being substantially higher than the second voltage, the method comprising:
providing a plurality of low voltage devices configured to withstand the second voltage;
operating the plurality of low voltage devices between a first switching voltage (SW) and a second switching voltage (Vdd2+SW), the first switching voltage switching between a reference voltage (GND) and the first voltage, and the second switching voltage substantially corresponding to a sum of the first switching voltage and the second voltage;
inverting a first input timing control signal to obtain a second input timing control signal,
coupling the first and second input timing control signals to the plurality of low voltage devices via a respective first and second capacitive couplings, the first and second capacitive couplings each comprising two series connected capacitors and a common node between the series connected capacitors, wherein the common node is configured to receive a respective one of the first and second timing control signals, and wherein terminals of the two series connected capacitors away from the common node are coupled to the first switching voltage and the second switching voltage respectively;
based on the operating and the coupling, generating, via the plurality of low voltage devices, an output timing control signal at a voltage higher than the first switching voltage; and
based on the generating, controlling the high voltage device.

34. The method of claim 33 wherein:
each of the first and the second input timing control signals comprises a pulse signal defined by a first voltage level, a second voltage level, a first transition from the first voltage level to the second voltage level, and a second transition from the second voltage level back to the first voltage level, and each of the first and second capacitive couplings is configured to respectively detect the first and second transitions of the first and the second timing control signals.

35. The method of claim 34, wherein the output timing control signal transitions between a low state with a voltage level substantially equal to the first switching voltage and a high state with a voltage level substantially equal to the second switching voltage.

36. The method of claim 35, wherein the generating further comprises:
based on the coupling:
detecting a rising edge of the first input timing control signal and generating a corresponding first pulse signal; and
detecting a falling edge of the second input timing control signal and generating a corresponding second pulse signal;
wherein a transition of the output timing control signal is based on concurrent detection of the rising edge of the first input timing control signal and the falling edge of the second input control signal.

37. The method of claim 36, wherein the generating further comprises:
based on the coupling:
detecting a rising edge of the second input timing control signal and generating a corresponding third pulse signal; and
detecting a falling edge of the first input timing control signal and generating a corresponding fourth pulse signal,
wherein a transition of the output timing control signal is further based on concurrent detection of the rising edge of the second input timing control signal and the falling edge of the first input control signal.

38. The method of claim 37, wherein the concurrent detection is based on an overlap of the first pulse signal and the second pulse signal, or an overlap of the third pulse signal and the fourth pulse signal.

39. The method of claim 37, wherein the generating of the first, second, third and fourth pulse signals comprises clamping an instantaneous voltage value of said pulse signals between the first and the second switching voltages.

40. A DC/DC converter for converting a first voltage (VIN) to a lower voltage output, the DC/DC converter comprising:
a transistor stack comprising a high side transistor and a low side transistor in series connection, the high side transistor and the low side transistor capable of withstanding a voltage higher than the first voltage;
a supply terminal connected to a drain of the high side transistor configured, during operation, to receive the first voltage;
a reference terminal connected to a source of the low side transistor configured, during operation, to receive a reference potential (GND);
an output switching terminal connected to a source of the high side transistor and to a drain of the low side transistor configured, during operation, to provide a first switching voltage (SW) switching between the first voltage and the reference potential; and
a high side level shifter coupled to the transistor stack configured to operate between the first switching voltage and a second switching voltage (Vdd2+SW), comprising:
i) a plurality of low voltage transistors capable of withstanding a second voltage (Vdd2) substantially lower than the first voltage;
ii) a high side reference terminal connected to the output switching terminal to provide the first switching voltage;
iii) a high side supply terminal configured, during operation, to provide the second switching voltage, the second switching voltage being substantially equal to a sum of the first switching voltage and the second voltage;
iv) a high side input terminal configured, during operation, to receive a first and a second input timing control signals for controlling the high side transistor;
v) a first and second capacitive couplings coupled to the high side input terminal configured, during operation, to detect timing control information based on the first and second input timing control signals, each of the first and second capacitive couplings comprising two series connected capacitors and a common node between the series connected capacitors, the common node configured to receive a respective one of the first and second timing control signals; and
vi) a high side output transistor of the plurality of low voltage transistors coupled to a gate of the high side transistor configured, during operation, to provide a high side control signal based on the detected timing control information at a voltage higher than the first switching voltage,
wherein the high side control signal controls a duty cycle of the first switching voltage at the output switching terminal.

41. The DC/DC converter of claim 40, wherein the lower voltage output is proportional to the average value of the first switching voltage.

42. The DC/DC converter of claim 40, further comprising a low side level shifter configured, during operation, to provide a low side control signal for the low side transistor based on the first and second input timing control signals.

43. The DC/DC converter of claim 42, wherein the high side control signal and the low side control signal are configured, during operation, to alternate conduction of the high side transistor and conduction of the low side transistor.

44. The DC/DC converter of claim 43, wherein a propagation delay of the first and second input timing control signals through the high side level shifter is equal to a propagation delay of the first and second input timing control signals through the low side level shifter.

45. The DC/DC converter of claim 44, wherein a signal attenuation of the first and second input timing control signals through the high side level shifter is equal to a signal attenuation of the first and second input timing control signals through the low side level shifter.

* * * * *